(12) United States Patent  (10) Patent No.: US 9,040,830 B2
Kobayashi et al.  (45) Date of Patent: May 26, 2015

(54) WIRING SUBSTRATE WITH SPRING TERMINAL AND MOUNTING STRUCTURE FOR THE SAME, AND SOCKET

(75) Inventors: Tomoki Kobayashi, Nagano (JP); Koyu Kamehama, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 159 days.

(21) Appl. No.: 13/616,557

(22) Filed: Sep. 14, 2012

(65) Prior Publication Data

US 2013/0084718 A1  Apr. 4, 2013

(30) Foreign Application Priority Data

Sep. 29, 2011 (JP) ................................. 2011-214041

(51) Int. Cl.
 H01R 4/48 (2006.01)
 H01R 12/00 (2006.01)
 H01L 23/50 (2006.01)
 H01L 23/498 (2006.01)
 H01R 13/24 (2006.01)

(52) U.S. Cl.
 CPC ...... *H01L 23/49811* (2013.01); *H01R 13/2442* (2013.01); *H01L 2224/16* (2013.01)

(58) Field of Classification Search
 CPC .................................................... H05K 1/11
 USPC .......... 174/250, 255, 259; 361/700, 704, 784, 361/764, 763; 439/66
 See application file for complete search history.

(56) References Cited

U.S. PATENT DOCUMENTS

| 5,102,352 | A |   | 4/1992 | Arisaka |
| 5,264,664 | A | * | 11/1993 | McAllister et al. ........... 174/261 |
| 5,599,208 | A | * | 2/1997 | Ward ....................... 439/620.09 |
| 6,027,346 | A | * | 2/2000 | Sinsheimer et al. ............ 439/66 |
| 6,777,620 | B1 | * | 8/2004 | Abe .............................. 174/255 |
| 6,815,619 | B2 | * | 11/2004 | Iwasaki et al. ................ 174/255 |
| 7,253,363 | B2 | * | 8/2007 | Iwasaki et al. ................ 174/255 |
| 7,778,041 | B2 | * | 8/2010 | Howell et al. ................. 361/803 |
| 8,033,835 | B2 | * | 10/2011 | Mulfinger et al. .............. 439/66 |
| 2002/0173175 | A1 | * | 11/2002 | Brodsky et al. ................. 439/66 |
| 2004/0107568 | A1 |   | 6/2004 | Khandros et al. |

(Continued)

FOREIGN PATENT DOCUMENTS

JP  Hei 5-74532 A  3/1993
JP  2001-15230 A  1/2001

(Continued)

OTHER PUBLICATIONS

Office Action dated Mar. 10, 2015 corresponding to Japan Patent Application No. 2011-214041 with English translation.

*Primary Examiner* — Timothy Thompson
*Assistant Examiner* — Michael F McAllister
(74) *Attorney, Agent, or Firm* — Kratz, Quintos & Hanson, LLP

(57) ABSTRACT

A wiring substrate with spring terminal, includes a wiring substrate including a first face and a second face on an opposite side to the first face, and a spring terminal mounted on the first face of the wiring substrate, wherein a wiring layer provided on the first face of the wiring substrate includes a first wiring pattern connected electrically to the spring terminal, and a first ground pattern grounded to a ground potential, and the first ground pattern is insulated from the first wiring pattern, and is formed on the first face to surround the first wiring pattern.

12 Claims, 18 Drawing Sheets

(56) References Cited

U.S. PATENT DOCUMENTS

| | | |
|---|---|---|
| 2005/0167816 A1 | 8/2005 | Khandros et al. |
| 2008/0132095 A1 | 6/2008 | Khandros et al. |
| 2008/0239683 A1* | 10/2008 | Brodsky et al. ............... 361/760 |
| 2009/0042413 A1* | 2/2009 | Ma ................................ 439/66 |
| 2010/0300742 A1* | 12/2010 | Ihara et al. .................... 174/261 |

FOREIGN PATENT DOCUMENTS

| | | |
|---|---|---|
| JP | 2001-160663 A | 6/2001 |
| JP | 2006-509215 A | 3/2006 |
| JP | 2010-277829 | 12/2010 |
| JP | 2010-277829 A | 12/2010 |

\* cited by examiner

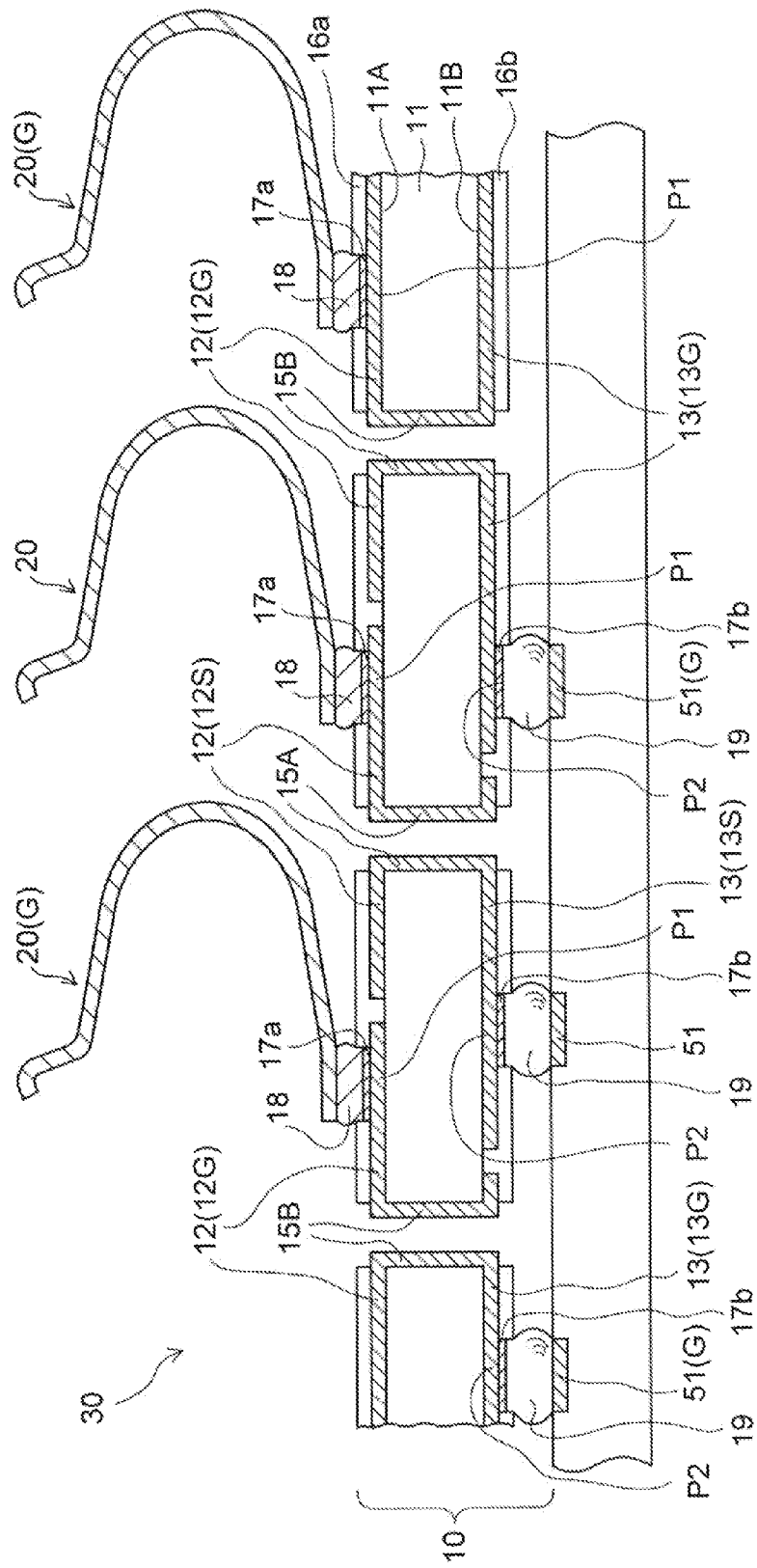

FIG. 8
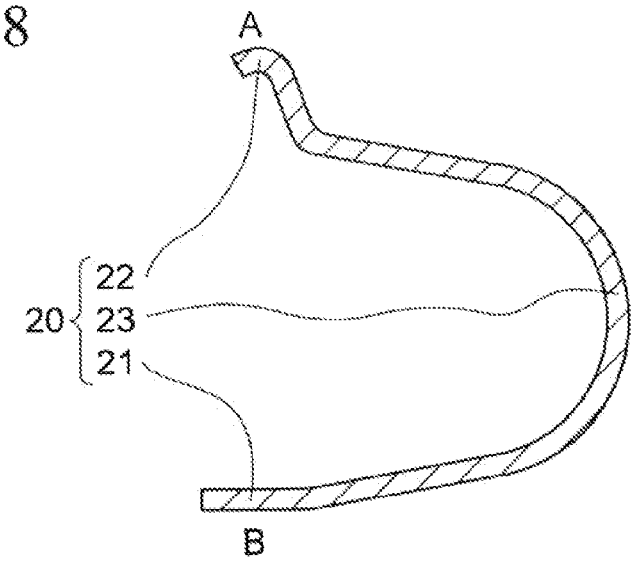
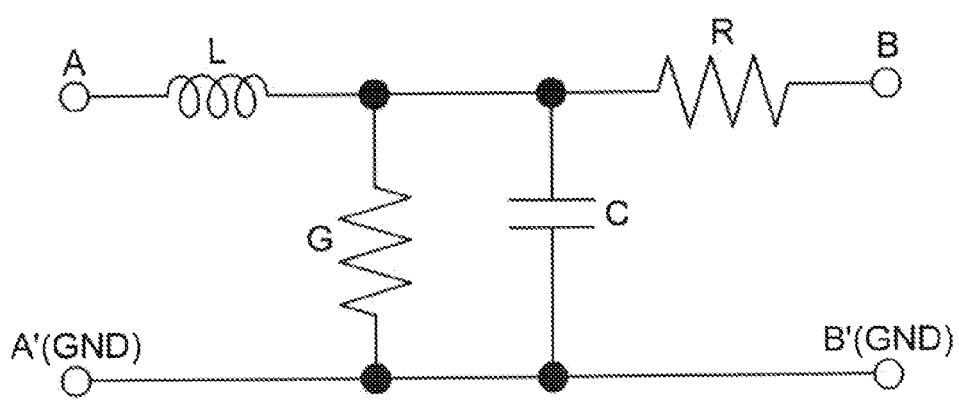

——————— GND plane is arranged (F/B – both face)
------- GND plane is arranged (F – face only)
—·—·— GND plane does not exist

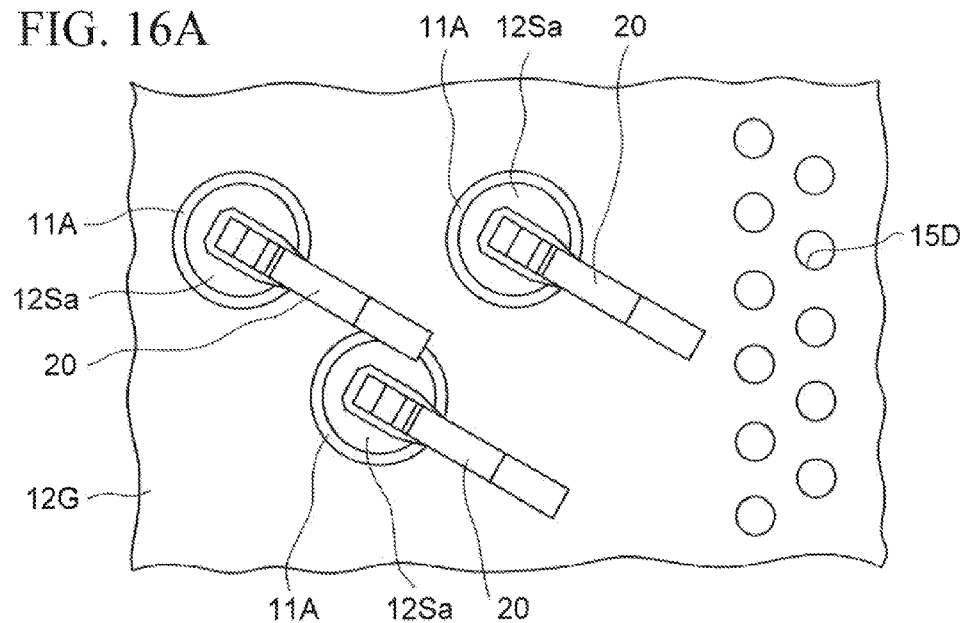
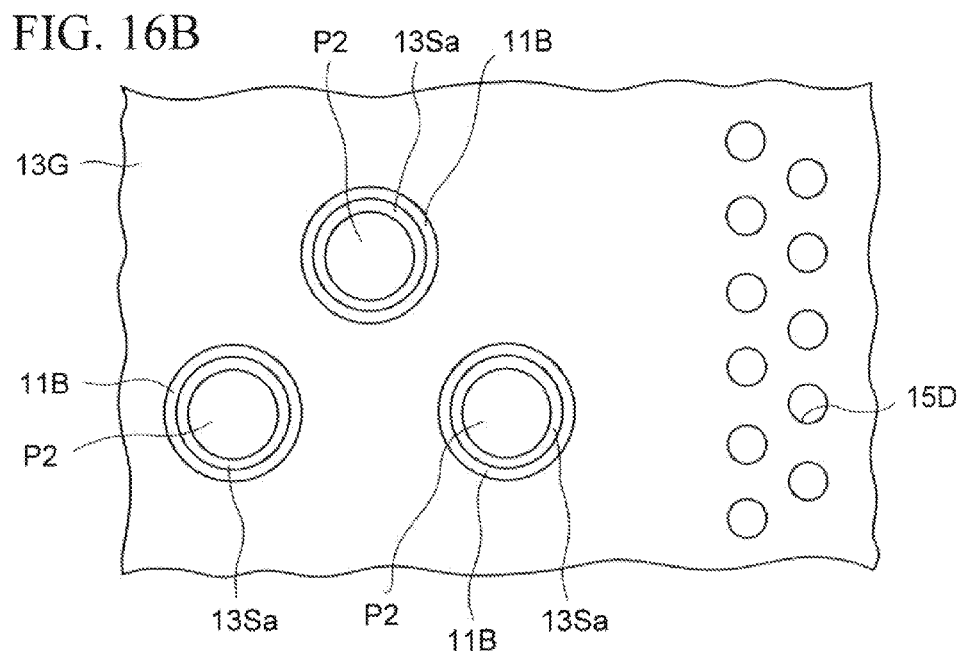

WIRING SUBSTRATE WITH SPRING TERMINAL AND MOUNTING STRUCTURE FOR THE SAME, AND SOCKET

CROSS-REFERENCE TO RELATED APPLICATIONS

This application is based upon and claims the benefit of priority of the prior Japanese Patent Application No. 2011-214041, filed on Sep. 29, 2011, the entire contents of which are incorporated herein by reference.

FIELD

It is related to a wiring substrate which includes connection terminals each having the property of spring (referred to as a "wiring substrate with spring terminal" hereinafter) and a mounting structure for the same, and a socket.

BACKGROUND

An LSI such as an MPU (Microprocessor Unit), or the like, which operates at a high speed (at a high frequency), has a package structure of an LGA (Land Grid Array) type. In order to mount these LSIs on a mounting substrate such as a motherboard, or the like and to make these LSIs operate stably, the socket (the LGA socket) which is adaptable to the LGA package is needed.

In such LGA socket, as the conductive member for maintaining the mutual electrical connection between the LGA package and the motherboard, connection terminals (contact pins) are provided. For instance, the movable prove pin (also called the "pogo pin") in which a spring is built, and the top end part is expanded and contracted vertically by the spring is employed. Also, the pin in which the top end part has the property of spring and is moved vertically, the pin (the spring terminal) in which the whole has the property of spring and is movable vertically, and the like are employed.

In the mode in which the pogo pin or the pin whose top end is shaped like a spring is used, through holes are formed in a heat resistant resin substrate, and then the pins are pushed into the through holes and mounted in it, and thus a resultant structure is used as the substrate for the LGA socket. On the other hand, in the mode in which the spring terminals are used, pins (spring terminals) are mounted on a printed substrate by the soldering, and thus a resultant structure is used as the substrate for the LGA socket.

An example of the mode in which the spring terminals are used is set forth in Patent Literature 1 (Japanese Laid-open Patent Publication No. 2010-277829).

When a transmission frequency of the signal is enhanced (a frequency of the signal is increased), the characteristic impedance of the transmission path is varied even though the signal transmission path has an infinitesimal length. For this reason, due to the mismatching of the characteristic impedance, a signal reflection is generated at the terminal of the transmission path, and then noise or phase shift of the signal is generated. As a result, the signal is not correctly transmitted, and thus it causes the occurrence of the malfunction in the circuit, or the like of the transmission destination.

As the countermeasure against these problems, in the signal wirings in the LSI or the LGA package and the signal wirings in the motherboard on which the LSI is mounted, the characteristic impedance is matched to 50Ω, and thus the signal reflection in the signal transmission path is suppressed.

On the contrary, in the wirings in the sockets which mutually connect the LGA package (LSI) and the motherboard, the impedance matching has not been particularly taken into account, under such an assumption that lengths of the wirings are almost negligible with respect to a transmission frequency of the signal (the wirings can be treated as lumped constant circuits).

However, a signal frequency of the LSI that includes a very high-speed arithmetic processing circuit such as MPU, or the like is reaching several GHz to several tens GHz. Therefore, also it is needed to treat the signal wirings in the sockets as distributed constant circuits to these frequencies. As a result, the signal wirings in the socket are now in such a situation that the signals cannot be correctly transmitted if the impedance matching is not properly applied to these signal wirings.

In the conventional socket which is adaptable to LGA package, the structure capable of matching and adjusting the impedances of the contact pins is not provided, in above both modes (the mode in which the pogo pins or the pins whose top end is shaped like a spring are employed, and the mode in which the spring terminals are employed). That is, the means for matching the impedances was not provided.

SUMMARY

According to one aspect discussed herein, there is provided a wiring substrate with spring terminal, which includes a wiring substrate including a first face and a second face on an opposite side to the first face, and a spring terminal mounted on the first face of the wiring substrate, wherein a wiring layer provided on the first face of the wiring substrate includes a first wiring pattern connected electrically to the spring terminal, and a first ground pattern grounded to a ground potential, and the first ground pattern is insulated from the first wiring pattern, and is formed on the first face to surround the first wiring pattern.

Also, according to another aspect discussed herein, there is provided a mounting structure of a wiring substrate with spring terminal, which includes the wiring substrate with spring terminal set forth as above, a connected member, and a mounting substrate, wherein the wiring substrate with spring terminal contacts an electrode terminal on the connected member through the spring terminal, and is connected to an electrode terminal on the mounting substrate through an external connection terminal provided on the second face side of the wiring substrate.

Also, according to still another aspect discussed herein, there is provided a socket, which includes the wiring substrate with spring terminal set forth as above, a mounting substrate, and a frame having an opening portion in which the wiring substrate with spring terminal is housed, wherein the frame is fixed to the mounting substrate, and the wiring substrate with spring terminal is connected to an electrode terminal on the mounting substrate through an external connection terminal provided on the second face side of the wiring substrate, in the opening portion of the frame.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A and 2B are views depicting a schematic constitution of the wiring substrate with spring terminal depicted in FIG. 1 when viewed from both surface sides, wherein FIG. 2A is a top view of the wiring substrate when viewed from the surface on which spring terminals are mounted, and FIG. 2B is a bottom view of the wiring substrate when viewed from the surface on the opposite side;

FIG. 6 is a sectional view for explaining another example of ground means of the GND plane in the wiring substrate with spring terminal in FIG. 1;

FIGS. 7A and 7B are views depicting a schematic constitution of the wiring substrate with spring terminal depicted in FIG. 6 when viewed from both surface sides, wherein FIG. 7A is a top view of the wiring substrate when viewed from the surface on which the spring terminals are mounted, and FIG. 7B is a bottom view of the wiring substrate when viewed from the surface on the opposite side;

FIG. 8 is a view for explaining a merit (#1) which is obtained by arranging a GND plane in a very near vicinity of the spring terminal;

FIGS. 14A and 14B are views depicting a schematic constitution of the wiring substrate with spring terminal depicted in FIG. 13 when viewed from both surface sides, wherein FIG. 14A is a top view of the wiring substrate when viewed from the surface on which spring terminals are mounted, and FIG. 14B is a bottom view of the wiring substrate when viewed from the surface on the opposite side;

FIGS. 16A and 16B are views depicting a schematic constitution of the wiring substrate with spring terminal depicted in FIG. 15 when viewed from both surface sides, wherein FIG. 16A is a top view of the wiring substrate when viewed from the surface on which spring terminals are mounted, and FIG. 16B is a bottom view of the wiring substrate when viewed from the surface on the opposite side;

DESCRIPTION OF EMBODIMENTS

Preferred embodiments of the present invention will be explained with reference to the accompanying drawings hereinafter.

First Embodiment: See FIG. 1 to FIG. 12B, FIG. 18

Figure 1:
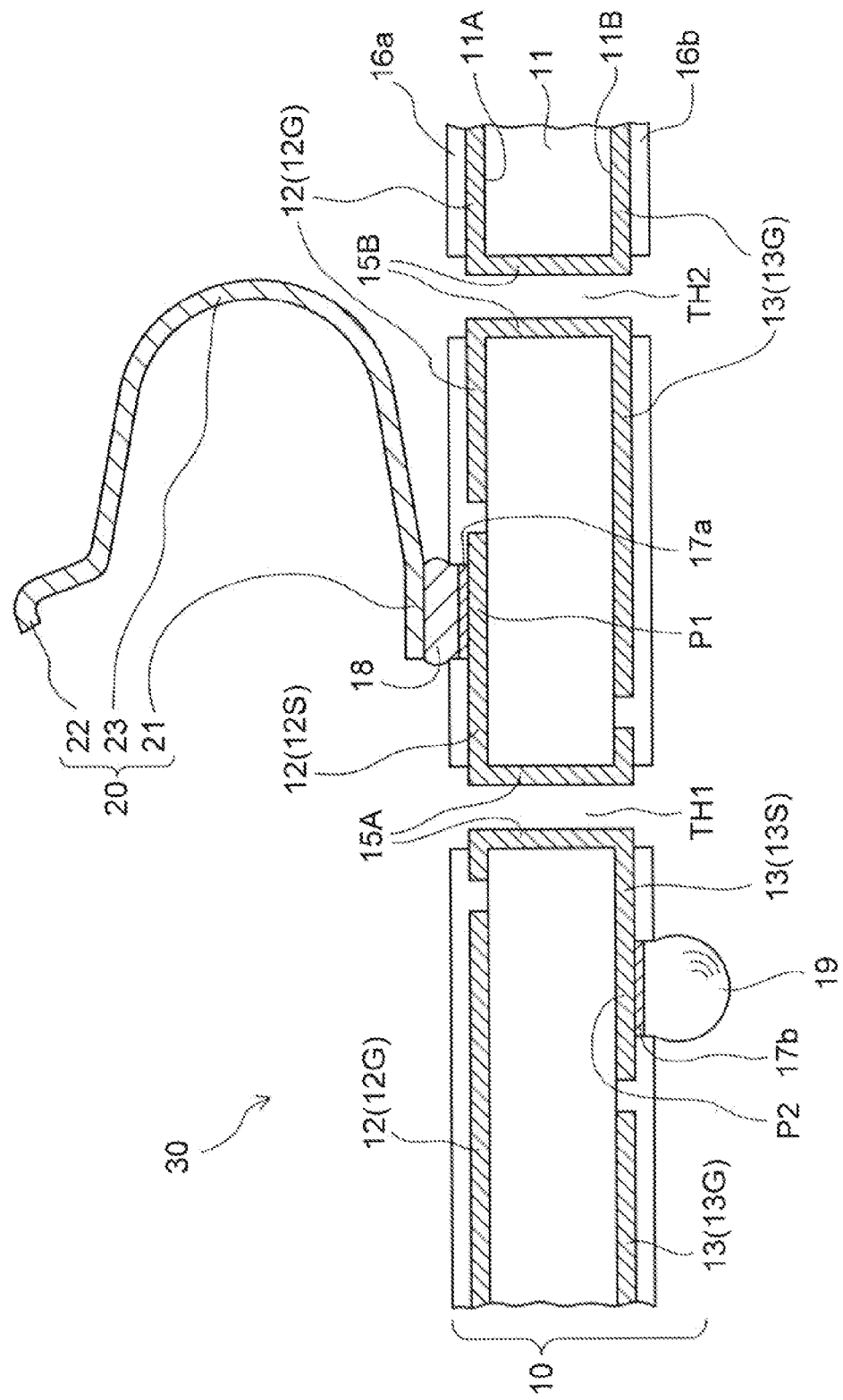
FIG. 1 is a sectional view depicting a constitution of a wiring substrate with spring terminal according to a first embodiment.

FIG. 1 depicts a constitution of a wiring substrate with spring terminal 30 according to a first embodiment in the form of a sectional view.

The wiring substrate with spring terminal 30 of the present embodiment includes a wiring substrate 10, and spring terminals 20 mounted on one face of this wiring substrate 10. This wiring substrate with spring terminal 30 is installed into the LGA socket, as described later, and is used as a conducting means which electrically connects a connected member (in the present embodiment, an LGA package) and a mounting substrate (in the present embodiment, a motherboard) mutually.

The wiring substrate 10 includes a resin substrate 11 constituting a substrate main body, and wiring layers 12, 13 patterned in a predetermined shape on both faces of the resin substrate 11 respectively. Also, the wiring substrate 10 includes solder resist layers 16a, 16b formed to cover the wiring layers 12, 13 and the resin substrate 11, on the both face side respectively, such that parts of pads P1, P2 defined in predetermined locations of the respective wiring layers 12, 13 are exposed.

As one mode of the resin substrate 11, a double-sided wiring substrate which is formed based on a base material (a double-sided copper-clad substrate), which is obtained by depositing a copper foil on both faces of a sheet made of a glass epoxy resin, is used. Also, as another mode, a wiring substrate having a multilayer structure which can be formed by the build-up method, or the like is used. The wiring layers 12, 13 (the outermost wiring layers of the wiring substrate 10) formed on both faces of the resin substrate 11 are electrically connected to each other through wiring layers (not shown) which are formed appropriately in predetermined locations in the inside of the substrate, and conductor vias (not shown) which connect the wiring layers mutually. As the material of the wiring layers 12, 13, typically copper (Cu) is used. Also, as the insulating material of the resin substrate 11, an epoxy-based resin, or the like is used.

The wiring layer 12 arranged on an upper face 11A (for convenience sake, this face is also referred to as an "F-face") of the resin substrate 11 is formed to include wiring patterns 12S (containing the pads P1) for the signal transmission, and a pattern 12G grounded to a ground (GND) potential (referred to as a "GND pattern 12G" hereinafter). Similarly, the wiring layer 13 arranged on a bottom face 11B (for convenience sake, this face is also referred to as a "B-face") of the resin substrate 11 is also formed to include wiring patterns 13S (containing the pads P2), and a pattern 13G. Specific shapes, etc of the respective wiring patterns 12S, 13S and the respective GND patterns 12G, 13G will be explained later.

The wiring patterns 12S, 13S formed on the F-face 11A and the B-face 11B of the resin substrate 11 are electrically connected through vias 15A. Similarly, the GND patterns 12G, 13G formed on the F-face 11A and the B-face 11B are also electrically connected through vias 15B. The respective vias 15A, 15B are formed of a conductor layer (e.g., a Cu plating layer whose thickness is about 20 μm) which is formed on inner wall surfaces of through holes TH1, TH2 (e.g., a diameter of which is about 150 μm) respectively.

These through holes TH1, TH2 are formed to penetrate the resin substrate 11 in a thickness direction.

In the example in FIG. 1, the vias 15A, 15B are provided with the form of a "conductor layer". But it is of course that the vias 15A, 15B are not restricted to this form. Any conductive material (a conductor) may be filled in the through holes TH1, TH2, and then the filled conductor may be used as the via.

In the solder resist layer 16a which is formed to cover the F-face 11A side of the resin substrate 11, opening portions (e.g., a diameter of which is about 400 μm) which expose the pads P1 are provided. A Ni/Au plating layer 17a (e.g., whose thickness is about 3 μm) formed by applying the nickel (Ni) plating and the gold (Au) plating in this order is formed on the pads P1 which are exposed from the opening portions. Also, a solder 18 (e.g., whose thickness is about 50 μm) is deposited on the Ni/Au plating layers 17a, and the spring terminal 20 is connected to the Ni/Au plating layers 17a through this solder 18.

Meanwhile, a Ni/Au plating layer 17b is similarly formed on the pads P2 as well which are exposed from the opening portions (e.g., a diameter of which is about 560 μm) in the solder resist layer 16b which is formed to cover the B-face 11B side of the resin substrate 11. Also, external connection terminals (solder balls 19) used when the wiring substrate with spring terminal 30 is mounted on the motherboard are joined onto the Ni/Au plating layers 17b.

The parts of the Au layers constituting the Ni/Au plating layers 17a, 17b which are formed on the respective pads P1, P2, contribute to enhance the contact property when the solders 18 are deposited and the solder balls 19 are joined. The parts of the Ni layers enhance the adhesion property between the metal (Cu) constituting the pads P1, P2 and the Au layer, and thus contribute to that it is prevented that the metal (Cu) diffuses into the Au layer.

As the solder 18 and the solder ball 19, for example, a lead (Pb)-free solder composed of tin (Sn), silver (Ag), and copper (Cu) is used. In this case, the solder and the solder ball are not limited to this Pb-free solder, and a eutectic solder composed of Sn and Pb may be used.

The wiring substrate 10 is selected such that a thickness of the substrate main body (the resin substrate 11) is about 0.2 to 1.0 mm and a height of the solder ball 19 is about 0.2 to 0.5 mm.

As depicted in FIG. 1, the spring terminal 20 mounted on the wiring substrate 10, when roughly classified, is formed of three parts (a junction part 21, a contact part 22, and a spring part 23), and has such a structure that these parts are formed integrally. The spring terminal 20 is made of a metal material that has adequate elasticity (property of spring, flexibility), as described later.

A size of the spring terminal 20 is selected such that its height (length from a lower end surface of the junction part 21 to an upper end surface of the contact part 22) is about 0.5 to 2.0 mm, its depth (length from a side end surface of the junction part 21 to the farthest outer side surface of the spring part 23 in the direction that intersects orthogonally with a height direction) is about 0.5 to 2.0 mm, and its width (length in the direction that intersects orthogonally with the height direction and the depth direction) is about 0.1 to 0.5 mm, for example. Also, a thickness of a metal thin plate constituting the spring terminal 20 is selected as about 0.08 mm.

The junction part 21 of the spring terminal 20 is the part which is connected to the pad P1 (the Ni/Au plating layer 17a) of the wiring substrate 10 through the solder 18 (FIG. 1). This junction part 21 is connected to one end part (in the depicted example, the lower side) of the spring part 23, and has a width that is wider than that of the spring part 23 (see FIG. 9). Both surfaces of the junction part 21 are formed to have a flat shape.

Since the junction part 21 is formed in such shape, a junction area when the junction part 21 is joined to the pad P1 (the Ni/Au plating layer 17a) of the wiring substrate 10 can be increased, and thus sufficient soldering strength can be ensured. That is, a degree of adhesion to the flat pad P1 (the Ni/Au plating layer 17a) which is joined, of the opponent side can be enhanced.

The contact part 22 is the part which contacts the pad of the LGA package connected to the wiring substrate with spring terminal 30. This contact part 22 is connected to the other end part (in the depicted example, the upper side) of the spring part 23, and is arranged in the position that opposes to the junction part 21 when viewed along a height direction of the spring terminal 20. The contact part 22 has the same width as the spring part 23 (see FIG. 9), and is formed to have the shape that protrudes outward (in the direction going away from the junction part 21). More specifically, the contact part 22 is formed to protrude from the spring part 23 toward the outer side and curve like a circular arc from this protruded part toward the inner side.

The merits described hereunder can be achieved by forming the contact part 22 in such shape. First, the provision of the protruded part can prevent such a situation that, due to the deformation of the spring part 23 when the contact part 22 is pushed by the pad of the LGA package, a touch between the LGA package and the end part (the part connected to the contact part 22) of the spring part 23 can be prevented (the prevention of the damage of the spring terminal 20). Also, since the top end part of the contact part 22 is curved, when this curved part is pushed by the pad of the LGA package, it can be prevented that the pad is damaged by this curved part.

The spring part 23 is formed to have a shape that is curved toward the outer side (in the direction going away from the junction part 21 and the contact part 22). By forming in such shape, the spring part 23 can elastically deform in the height direction.

One end part (the side connected to the junction part 21) of this spring part 23 is fixed, while the other end part (the side connected to the contact part 22) is worked as a free end. Therefore, when the pad of the LGA package is pushed toward the contact part 22 and touches it, the spring part 23 contributes to maintain stably a contact state between the pad and the contact part 22 by its elastic force against the pushing force. The spring part 23 functions as a "spring" integrally with the contact part 22. At this time, a spring constant is selected as about 0.6 to 0.8 N/mm, for example.

Figure 2A:
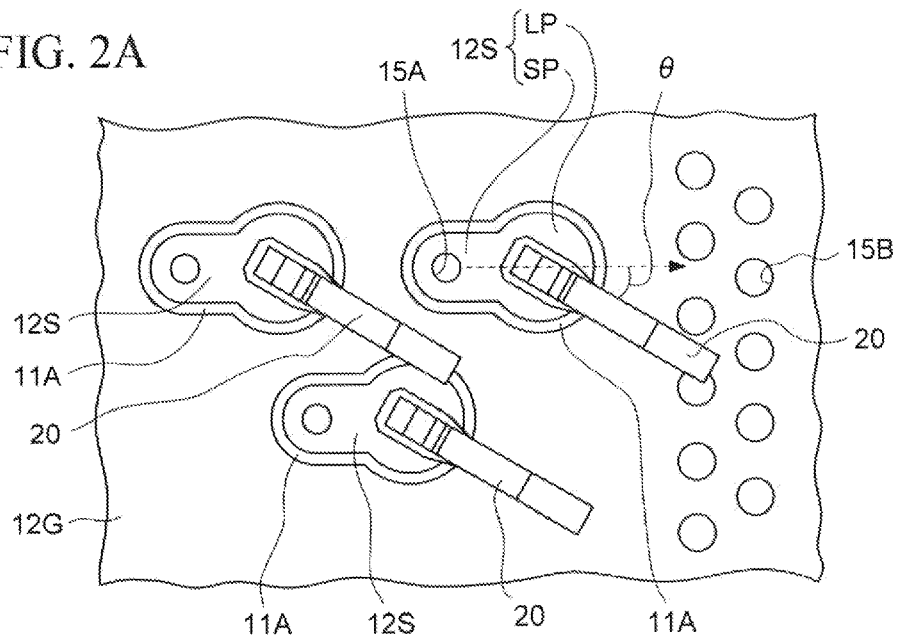
Figure 2B:
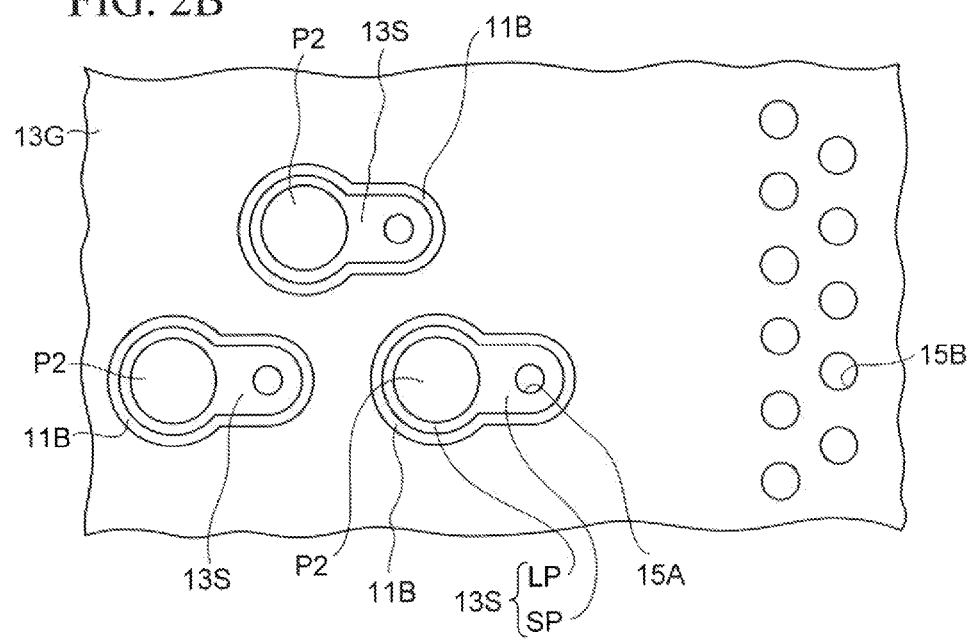

FIGS. 2A and 2B depict a schematic constitution of the wiring substrate with spring terminal 30 (FIG. 1) of the present embodiment when viewed from both surface sides. FIG. 2A is a top view of the wiring substrate 30 when viewed from the surface on the side on which the spring terminals 20 are mounted, and FIG. 2B is a bottom view of the wiring substrate 30 when viewed from the surface on the opposite side. In the constitution of FIGS. 2A and 2B, illustrations of the solder resist layers 16a, 16b, the Ni/Au plating layers 17a, 17b, the solders 18, and the solder balls 19 are omitted.

As depicted in FIG. 2A, the wiring pattern 12S for the signal transmission, which is arranged on the upper surface side (the F-face 11A of the resin substrate 11) of the wiring substrate 10 (FIG. 1), is patterned in such a shape that a large circular part LP is connected to a small, circular part SP (a shape that looks like a "potbellied shape"). For example, the large circular part LP is selected to have a diameter of about 600 μm, the small circular part SP is selected to have a diameter of about 350 μm, and a center distance between the parts LP, SP is selected as about 500 μm. The wiring patterns 12S are formed with numbers corresponding to the installation numbers of the spring terminals 20, and are aligned in an array fashion.

Also, the GND pattern 12G arranged on the same F-face 11A of the resin substrate 11 is insulated from the wiring patterns 12S (for example, a clearance of about 80 μm is kept between them), and is patterned like a "plane layer" on the F-face 11A such that this GND pattern 12G surrounds respective wiring patterns 12S. That is, the GND pattern 12G constitutes a "ground plane".

The spring terminal 20 is connected onto the wiring patterns 12S (the large circular parts LP) respectively. The spring terminals 20 are aligned to have a predetermined angle θ (e.g., 25 to 35°) to their arrangement direction (in FIG. 2A, the direction indicated with a broken-line arrow). That is, the spring terminals 20 are aligned to incline with respect to their arrangement direction. By employing such arrangement mode, the installation numbers of the spring terminals per unit area can be increased in comparison with the case that the spring terminals are aligned in parallel with their arrangement direction. This arrangement mode contributes to a narrower pitch of the contact parts 22 of the spring terminals 20, which can be adaptable to a narrower pitch of the pads of the LGA package.

Meanwhile, as depicted in FIG. 2B, similarly the wiring pattern 13S for the signal transmission, which is arranged on the bottom surface side (the B-face 11B of the resin substrate 11) of the wiring substrate 10 (FIG. 1), is also patterned in such a shape that the large circular part LP is connected to the small circular part SP (the shape that looks like the "potbellied shape"). In this case, a diameter of the large circular part LP is selected as about 680 μm. The wiring patterns 13S are formed with numbers corresponding to the installation numbers of the external connection terminals (solder balls 19), and are aligned in an array fashion. Then, the wiring patterns 13S are electrically connected to the corresponding wiring patterns 12S, which are formed on the F-face 11A on the opposite side, mutually through the vias 15A.

Also, similarly the GND pattern 13G arranged on the same B-face 11B of the resin substrate 11 is insulated from the respective wiring patterns 13S, and is patterned like a "plane layer" on the B-face 11B such that this GND pattern 13G surrounds respective wiring patterns 13S. That is, also the GND pattern 13G constitutes "ground plane". Also, this GND pattern 13G is electrically connected to the GND pattern 12G, which is formed on the F-face 11A on the opposite side, mutually through plural vias 15B.

The wiring substrate with spring terminal 30 according to the present embodiment can be manufactured by utilizing the technology that the applicant of this application has already proposed (Patent Literature 1 mentioned above), for example. Here, details of the manufacturing method will be omitted herein, but an example of the manufacturing method will foe explained schematically as follows.

First, the spring terminals 20 which are to be mounted on the wiring substrate 10 are prepared. The spring terminals 20 can be fabricated in such a manner that patterns of the spring terminals 20 that should be formed (patterns corresponding to the shape when this spring terminal 20 is unbent into a planar shape) are punched out from a metal thin plate of uniform thickness by using the die (stamping), and then the patterns are bent into a predetermined shape by applying the bending processing. The patterns corresponding to predetermined shapes of the spring terminals 20 can be obtained by the etching instead of the stamping.

As the material of the metal thin plate to be used, any material having adequate elasticity (property of spring, flexibility), for example, a copper (Cu)-based alloy such as beryllium copper (Cu—Be), phosphor bronze (Cu—Sn), Corson material (Cu—Ni—Si—Mg, Cu—Ni—Si, Cu—Ni—Co—Si—Cr, or the like), or the like, may be preferably used.

Also, after the patterns corresponding to the shapes of the spring terminals 20 are obtained by the stamping or the etching, the Ni plating, the Ni—Co alloy plating, or the like is applied, to the surface of the metal thin plate. In the case that the alloy plating containing cobalt (Co) is applied, such alloy plating is effective in that the elasticity of the spring terminal 20 can be enhanced. The Ni plating, or the like may be performed either before the bending is applied or after the bending is applied. Then, the gold (Au) plating is applied to the surfaces that the Ni plating, or the like is performed (at least the junction part 21 and the contact part 22).

Then, the spring terminals 20 fabricated in this manner are temporarily fixed onto a jig for terminal alignment. Concave portions are provided in this jig so as to coincide with the alignment of the pads P1 of the wiring substrate 10 on which the spring terminals 20 are mounted finally. The temporary fixing of the spring terminals 20 can be performed by the transfer method, the pick & place method, or the like.

For example, in the case of the pick & place method using the stitching machine, each of the spring terminals 20, in which the stamping (or the etching) and the bending were performed in the metal thin plate (frame) so as to assume a predetermined shape, is picked up while being broken off from the metal frame (pick), and then is pushed into the corresponding concave portion provided on the jig (place). By this matter, the spring terminals 20 are temporarily fixed in the respective concave portions provided in the jig correspondingly. At that time, the spring terminals 20 are temporarily fixed such that the junction part 21 of the spring terminal 20 is protruded from the concave portions provided on the jig. In this way, the junction part 21 is protruded, thereby the junction of the pads of the wiring substrate 10 to the junction, parts 21 is facilitated.

Then, the wiring substrate 10 for fixing and mounting the spring terminals 20 which are temporarily fixed on the jig, is prepared. As a mode of the wiring substrate 10, such a structure that the resin substrate 11 is used as the substrate main body, as described above, can be used. A proper amount of solder 18 is deposited onto the pad P1 (the Ni/Au plating layer 17a) exposed from the solder resist layer 16a on one surface side of this wiring substrate 10. Also, the solder ball 19 is joined onto the pad P2 (the Ni/Au plating layer 17b) exposed from, the solder resist layer 16b on the other surface side.

Then, the above structural body (in which plural pieces of spring terminals 20 are temporarily fixed and aligned on the jig) is joined onto the wiring substrate 10. More particularly, the surface of the wiring substrate 10 on the side on which the solders 18 are deposited, is opposed to and aligned with the surface of the jig on the side to which the spring terminals 20 are temporarily fixed, and then the solders 18 are made to touched the corresponding junction parts 21 of the spring terminals 20. Then, the solders 18 are melted by applying the reflow heating, so that the junction parts 21 of the spring terminals 20 are electrically connected to the pads P1 (the Ni/Au plating layers 17a) of the wiring substrate 10.

The solder 18 is used in the present embodiment, but a conductive resin paste, or the like may be used in place of the solder 18. For example, an Ag paste in which silver (Ag) fillers are contained in an insulating resin such as an epoxy resin, or the like can be used. In this case, the Ag pastes which are deposited on the pads P1 of the wiring substrate 10 are made to touch the junction parts 21 of the spring terminals 20, and then the Ag pastes are cured by heating to connect electrically the pads P1 and the junction parts 21.

By the above steps, the wiring substrate with spring terminal 30 of the present embodiment, is fabricated.

Figure 3:
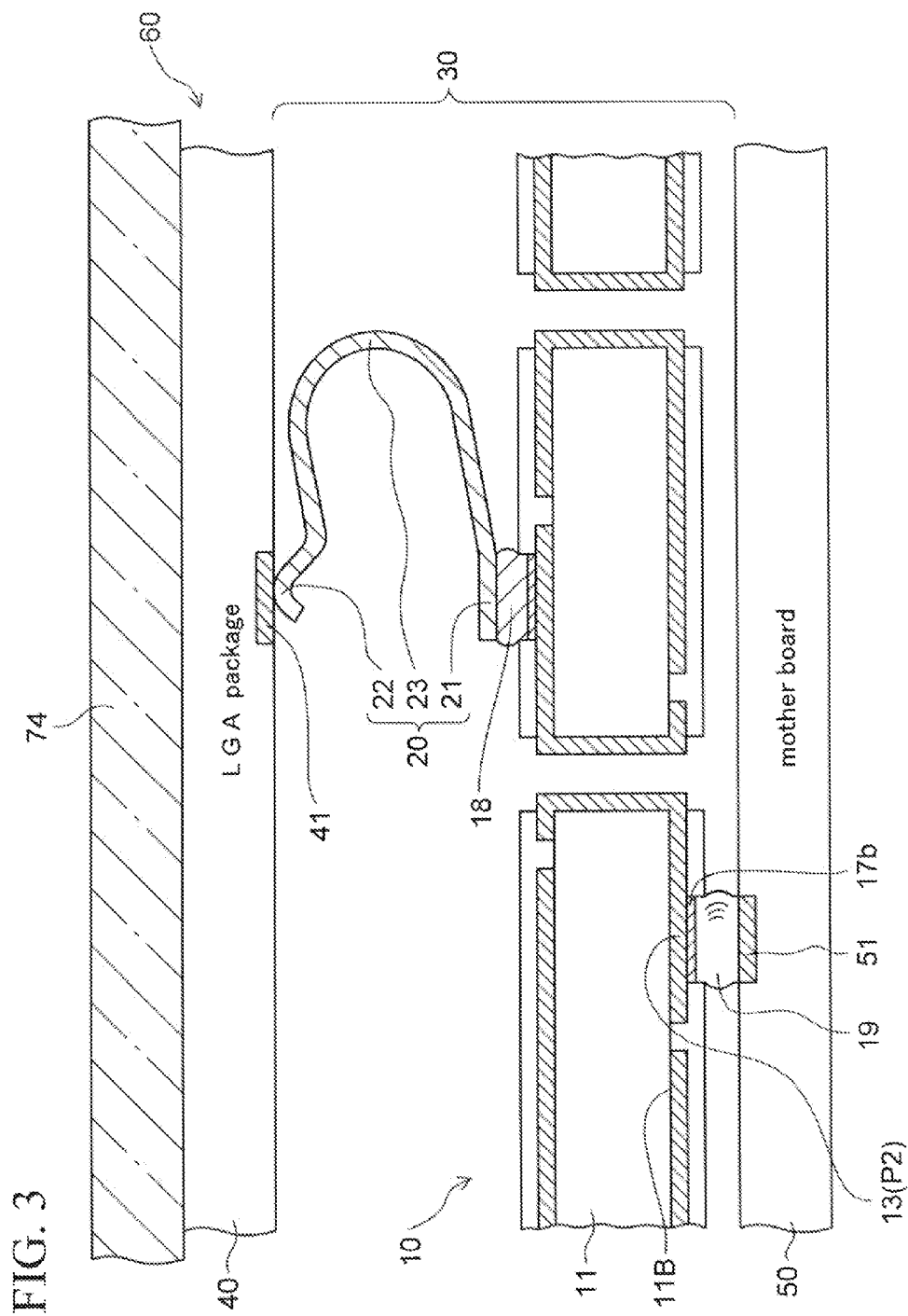
FIG. 3 is a sectional view depicting an example of a mounting structure of the wiring substrate with spring terminal.
Figure 18:
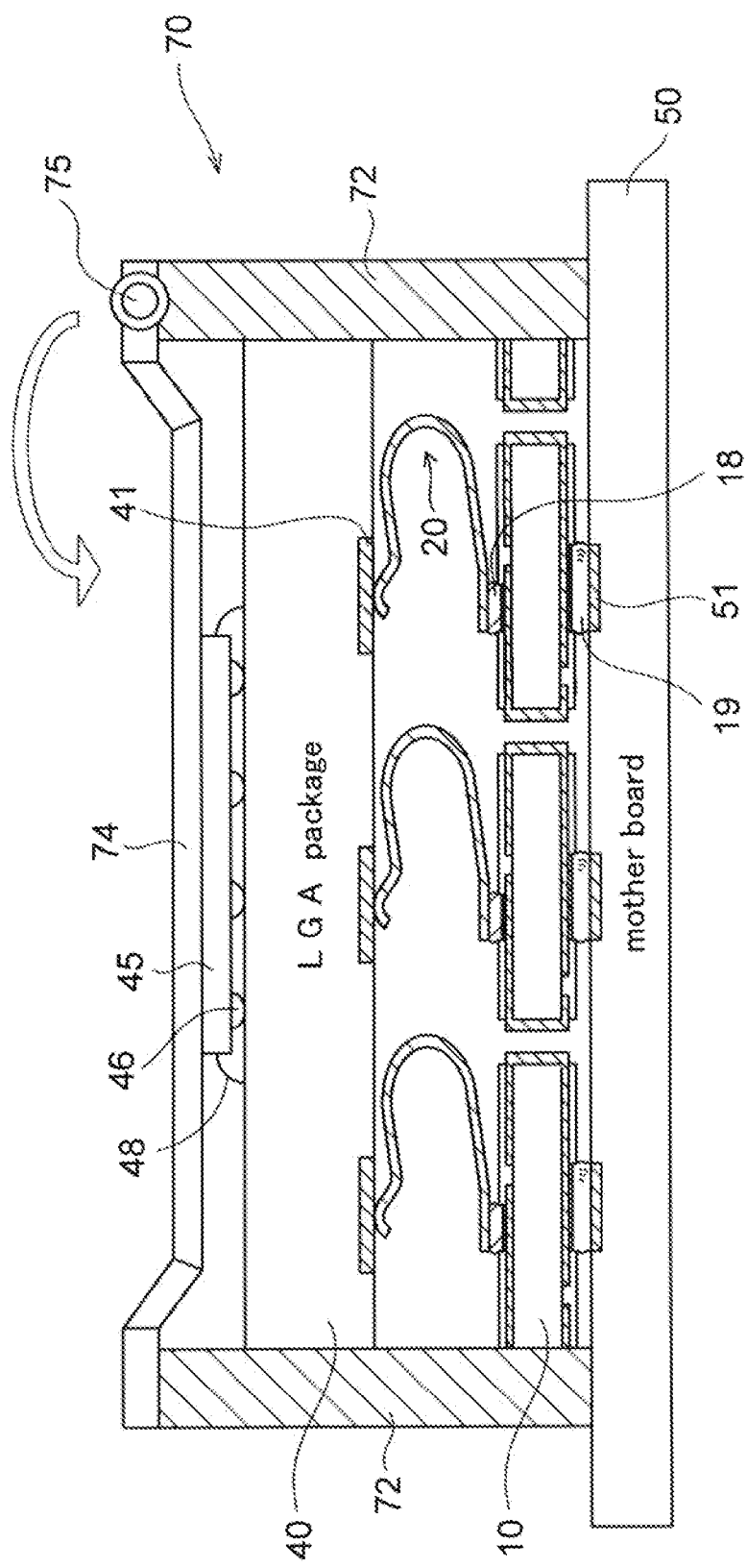
FIG. 18 is a sectional view depicting a constitution of an LGA socket to supplementarily explain the mounting structure depicted in FIG. 3.

FIG. 3 depicts an example of a mounting structure of the wiring substrate with spring terminal 30 according to the first embodiment (a mounting structure in which the wiring substrate with spring terminal 30 is interposed between an LGA package 40 and a motherboard 50 to connect electrically them) in the form of a sectional view. Also, FIG. 18 depicts a constitution of the LGA socket to supplementarily explain this mounting structure in the form of a sectional view.

In a mounting structure 60 depicted in FIG. 3, the wiring substrate with spring terminal 30 is connected to the corresponding pads 51 (electrode terminals) provided on the motherboard 50, through the solder balls 19 (the external connection terminals) which are joined to the pads P2 (the Ni/Au plating layers 17b) arranged on the B-face 11B of the resin substrate 11 of the wiring substrate 10.

The LGA package 40 has the mode of a build-up wiring substrate, for example. An LSI (semiconductor chip) 45 such as MPU (Microprocessor Unit), or the like, which operates at a high frequency, is mounted on the upper surface side of this LGA package 40 (see FIG. 18) for example. This LSI 45 is flip-chip mounted on the LGA package 40 through a conductive member 46 such as a solder bump, or the like. Also, an underfill resin 48 is filled between the LSI 45 and the LGA package 40. Meanwhile, pads 41 are provided on the lower surface side of the LGA package 40. Here, in the example in FIG. 3, illustrations of the LSI 45, the conductive members 46, and the underfill resin 48 are omitted.

This LGA package 40 is housed in a frame 72 of an LGA socket 70 (FIG. 18) together with the wiring substrate with spring terminal 30 (FIG. 3). For this purpose, the frame 72 of the LGA socket 70 is formed in a frame shape having an opening portion, into which the LGA package 40 and the wiring substrate with spring terminal 30 can be housed when viewed from the top. This frame 72 of the LGA socket 70 can be formed of engineering plastics, or the like, for example. By using the frame 72 having such shape, the mutual alignment between the wiring substrate with spring terminal 30 and the LGA package 40 which are mounted into the LGA socket 70, is performed easily.

The lower end surface of the frame 72 of the LGA socket 70 is fixed to the motherboard 50 by means of the screw clamp, or the like. In the meantime, a cap 74 made of metal is fitted to the upper end surface of the frame 72 such that this cap 74 can turn around universally to use a hinge portion 75 as a fulcrum. As depicted in FIG. 18, this cap 74 is formed in a shape whose inner part is protruded toward the inner side of the frame 72. By this matter, when the cap 74 is closed, the protrude part pushes an upper surface of the LGA package 40 (a back surface of the LSI 45) to push this LGA package 40 toward the wiring substrate with spring terminal 30.

The spring terminals 20 of the wiring substrate with spring terminal 30 which is mounted on the motherboard 50, contact the pads 41 (the electrode terminals) which are exposed from a solder resist layer (not shown) on the lower surface side of the LGA package 40, through the contact parts 22 (FIG. 3). At a time of this contact, the upper surface of the LGA package 40 (the back surface of the LSI 45 depicted in FIG. 18) is pushed by the cap 74 of the LGA socket 70. By this matter, the pads 41 located on the lower surface side of the LGA package 40 are pushed toward the contact parts 22 of the spring terminals 20, so that the spring parts 23 (FIG. 3) of the spring terminals 20 are compressed to the height direction (the direction which intersects orthogonally with the face of the pad 41 that the contact part 22 contacts) by the pushing force. As a result, a contact force between the contact part 22 of the spring terminal 20 and the pad 41 of the LGA package 40 can be increased, and also the electrical connection to the LGA package 40 can be done stably (improvement in the connection reliability).

Here, although not particularly depicted in the example in FIG. 18, a cap-shaped heat radiation plate which is adhered partially to the back surface of the LSI 45 may be provided on the LGA package 40, as the need arises. In the case of this mode, when the LGA package 40 is mounted on the socket 70, this heat radiation plate is pushed by the cap 74 (its protruded portion) of the socket 70.

Next, a method (grounding means) of grounding the GND planes 12G, 13G to the GND potential will be explained with reference to FIG. 4 to FIG. 7B hereunder.

Figure 4:
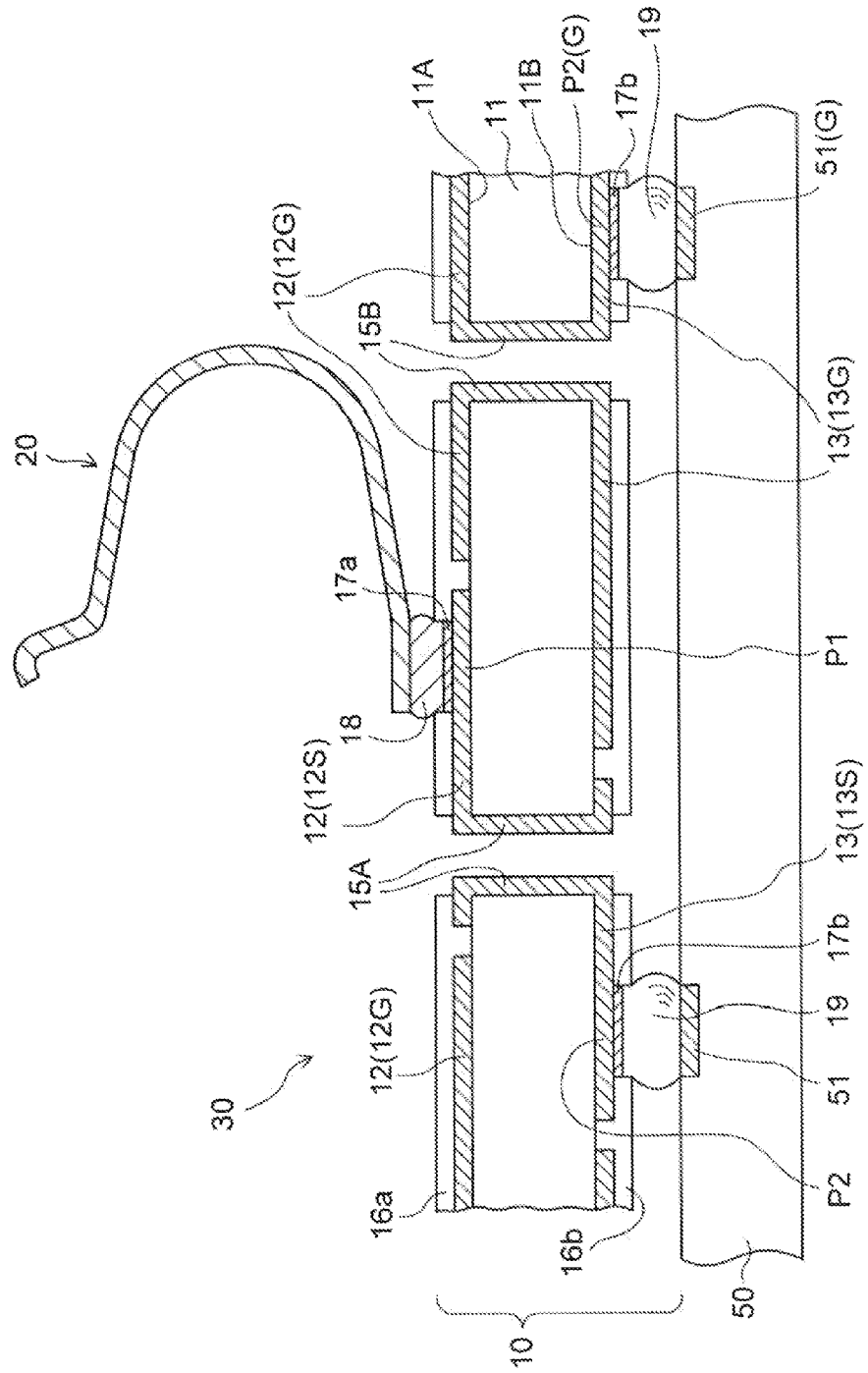
FIG. 4 is a sectional view for explaining an example of ground means of the GND plane in the wiring substrate with spring terminal in FIG. 1.
Figure 5:
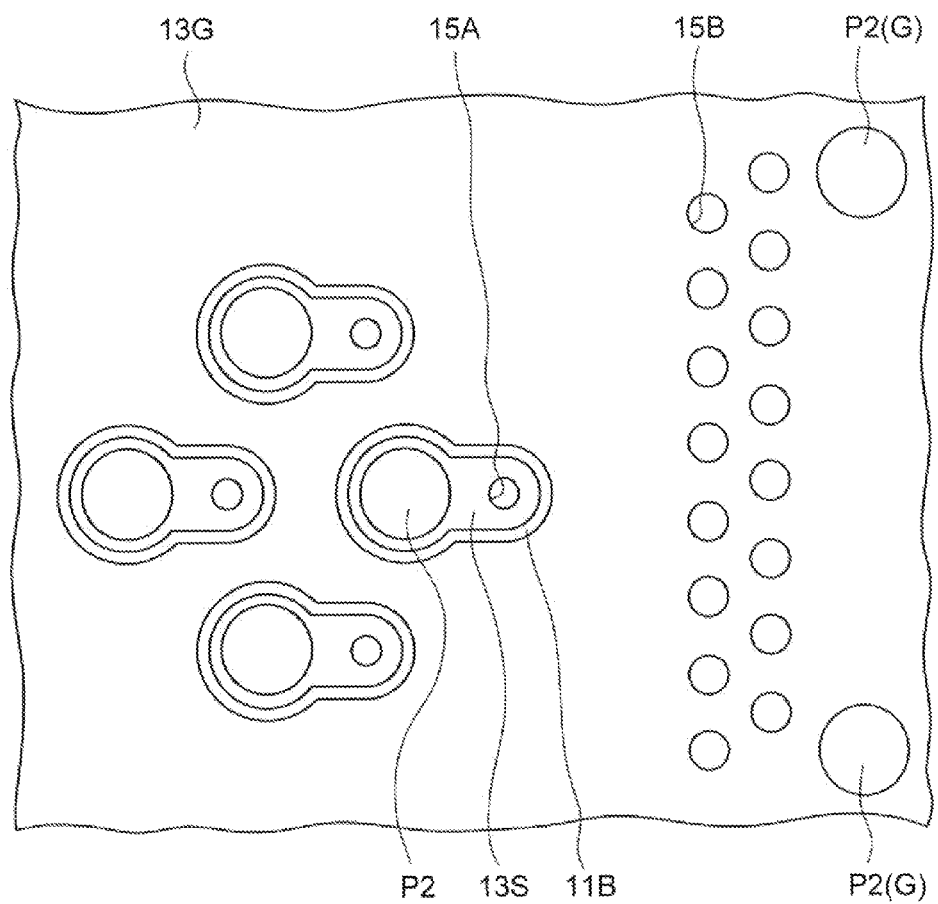
FIG. 5 is a bottom view depicting a schematic constitution of the wiring substrate with spring terminal depicted in FIG. 4 when viewed from the surface on the opposite side to the side on which the spring terminals are mounted.

FIG. 4 depicts a constitution of the wiring substrate with spring terminal 30 in the case that an example of the grounding means is applied, in the form of a sectional view. Also, FIG. 5 depicts a schematic constitution of the wiring substrate with spring terminal 30 in this case when viewed from the surface on the side opposite to the side on which the spring terminals 20 are mounted. In the constitution in FIG. 5, illustrations of the solder resist layer 16b, the Ni/Au plating layer 17b, and the solder ball 19 are omitted.

In the grounding method depicted in FIG. 4 and FIG. 5, the pads P2 (G) for the exclusive use of GND are provided on the bottom surface side (the B-face 11B of the resin substrate 11) of the wiring substrate 10, the pads 51 (G) for the exclusive use of GND are also provided on the motherboard 50 side that opposes to the resin substrate 11, and both pads P2 (G), 51 (G) are connected through the solder ball 19. By this matter, the GND plane 12G arranged on the F-face 11A of the resin substrate 11 and the GND plane 13G connected to this GND plane 12G through the vias 15B are connected to the GND potential through the pads P2 (G), the Ni/Au plating layers 17b, the solder balls 19, and the pads 51 (G).

Figure 7A:
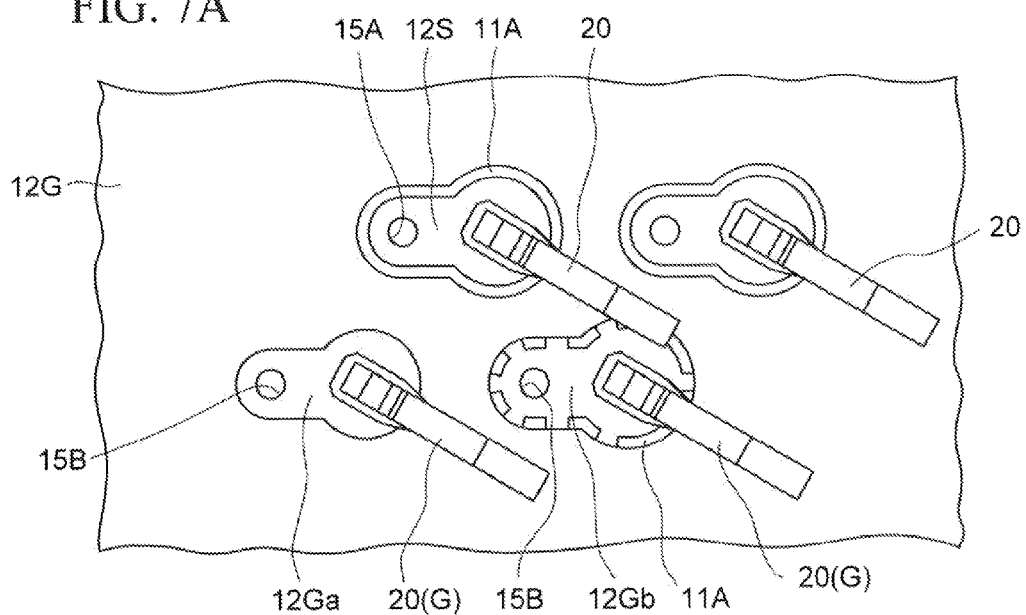
Figure 7B:
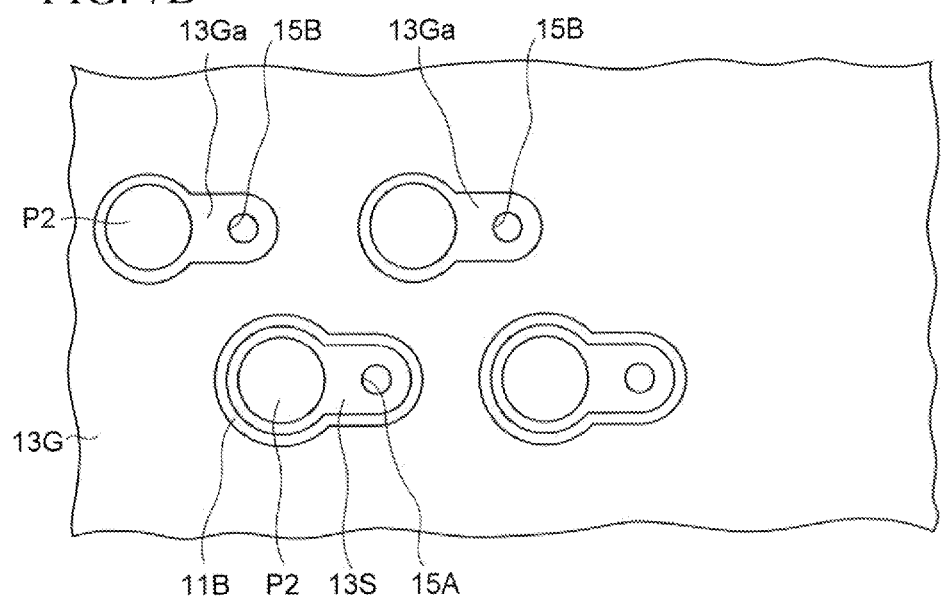

FIG. 6 depicts the constitution of the wiring substrate with spring terminal 30 in the case that another example of the grounding means is applied, in the form of a sectional view. Also, FIGS. 7A and 7B depict a schematic constitution of the wiring substrate with spring terminal 30 in this case when viewed from both surface sides. FIG. 7A is a top view of the wiring substrate with spring terminal 30 when viewed from the face on which the spring terminals 20 are mounted, and FIG. 7B is a bottom view of the wiring substrate with spring terminal 30 when viewed from the face on the opposite side. In the constitutions in FIGS. 7A and 7B, illustrations of the solder resist layers 16a, 16b, the Ni/Au plating layers 17a, 17b, the solders 18, and the solder balls 19 are omitted.

In the grounding method depicted in FIG. 6 and FIGS. 7A and 7B, the case where anyone of the spring terminals 20 is assigned in advance as a ground terminal 20(G) (i.e., the case where a layout of the electric signals in the spring terminals 20 is assigned in advance) is assumed as the premise. Specifically, wiring patterns 12Ga, 12Gb to which the spring terminal 20(G) assigned as the ground use is connected (see FIG. 7A) are connected to the GND plane 12G which is formed on the same F-face 11A (pattern short). In this case, the wiring pattern may be formed integrally with the GND plane 12G without clearance (the wiring pattern 12Ga), or the wiring pattern may be patterned in such a fashion that this wiring pattern is connected partially to the GND plane 12G (the wiring pattern 12Gb).

The wiring patterns 12Ga, 12Gb formed on the F-face 11A are connected to corresponding wiring patterns 13Ga formed on the B-face 11B on the opposite side through the via 15B respectively. Similarly, the wiring patterns 13Ga are connected to the GND pattern 13G which is formed on the same B-face 11B as well.

As explained above, according to the constitution of the wiring substrate with spring terminal 30 according to the first embodiment (see FIG. 1 to FIG. 3), the spring terminal 20 is connected to the wiring patterns 12S for the signal transmission arranged on the upper surface side (the F-face 11 of the resin substrate 11) of the wiring substrate 10, and also the GND pattern 12G is formed like a "plane layer" to surround this wiring patterns 12S (the GND plane). Similarly, the solder ball 19 is connected to the wiring patterns 13S for the signal transmission arranged on the bottom surface side (the B-face 11 of the resin substrate 11) of the wiring substrate 10, and also the GND pattern 13G is formed to surround the wiring patterns 13S. Also, the wiring patterns 13S and the GND pattern 13G formed on the B-face 11B side are connected to the wiring patterns 12S and the GND pattern 12G formed on the F-face 11A side through the vias 15A, 15B respectively.

In this manner, in the wiring substrate with spring terminal 30 of the first embodiment, such a structure is employed that the GND plane 12G is arranged in a very near vicinity of the spring terminals 20 which are used as a part of the signal transmission paths that electrically connects the connected member (the LGA package 40) and the mounting substrate (the mother board 50).

Various merits described hereunder can be obtained by arranging the GND plane 12G in the very near vicinity of the spring terminals 20 in this way. These merits will be explained with reference to FIG. 8 to FIG. 11 hereunder.

FIG. 8 depicts an equivalent circuit of the spring terminal 20. Here, the contact part 22 (its end part is indicated as "A") of the spring terminal 20 is assumed as the input side, while the junction part 21 (its end part is indicated as "B") is assumed as the output side. Then, this equivalent circuit is represented by a resistance component R and an inductance component L which are connected in series between the input and the output, and a conductance component G and a capacitance component C which are connected in parallel. Here, respective components R, L, G, C denote a value per unit length respectively. Also, a terminal A' for the input terminal A and a terminal B' for the output terminal B correspond to the GND plane 12G.

The characteristic impedance Z0 is calculated based on respective equations of the voltage and the current on the paths, which are obtained by solving the partial differential equation derived from this equivalent circuit (FIG. 8) (their derivations are omitted). This characteristic impedance Z0 is expressed by following Equation (1).

$$Z0=\sqrt{\{(R+j\omega L)/(G+j\omega C)\}} \quad (1)$$

It is assumed that a loss in the conductor part (the resistance component R) and a loss in the dielectric part (the conductance component G) are sufficiently small and negligible. Then, above Equation (1) can be approximated by following Equation (2).

$$Z0 \approx \sqrt{(L/C)} \quad (2)$$

Here, when the GND plane is not provided in the very near vicinity of the spring terminal 20, it seems that the capacitance component C which is equivalently formed is small. Therefore, the characteristic impedance Z0 of the spring terminal 20 in this case exhibits an "inductive characteristic", and has a relatively high value (see above Equation (2)).

On the other hand, like the present embodiment (FIG. 1, FIGS. 2A and 2B), in the case that the mounting face (the F-face 11A of the resin substrate 11) of the spring terminal 20 is covered with the GND plane 12G, the equivalent capacitance component C is formed between the spring terminal 20 and the GND plane 12G located in the very near vicinity of this spring terminal 20. As a result, the characteristic impedance Z0 of the spring terminal 20 is relatively lowered (see above Equation (2)). That is, the characteristic impedance Z0 of the spring terminal 20 can be varied by arranging the GND plane 12G in the very near vicinity of the spring terminal 20. This means that the characteristic impedance Z0 can be adjusted.

Figure 9:
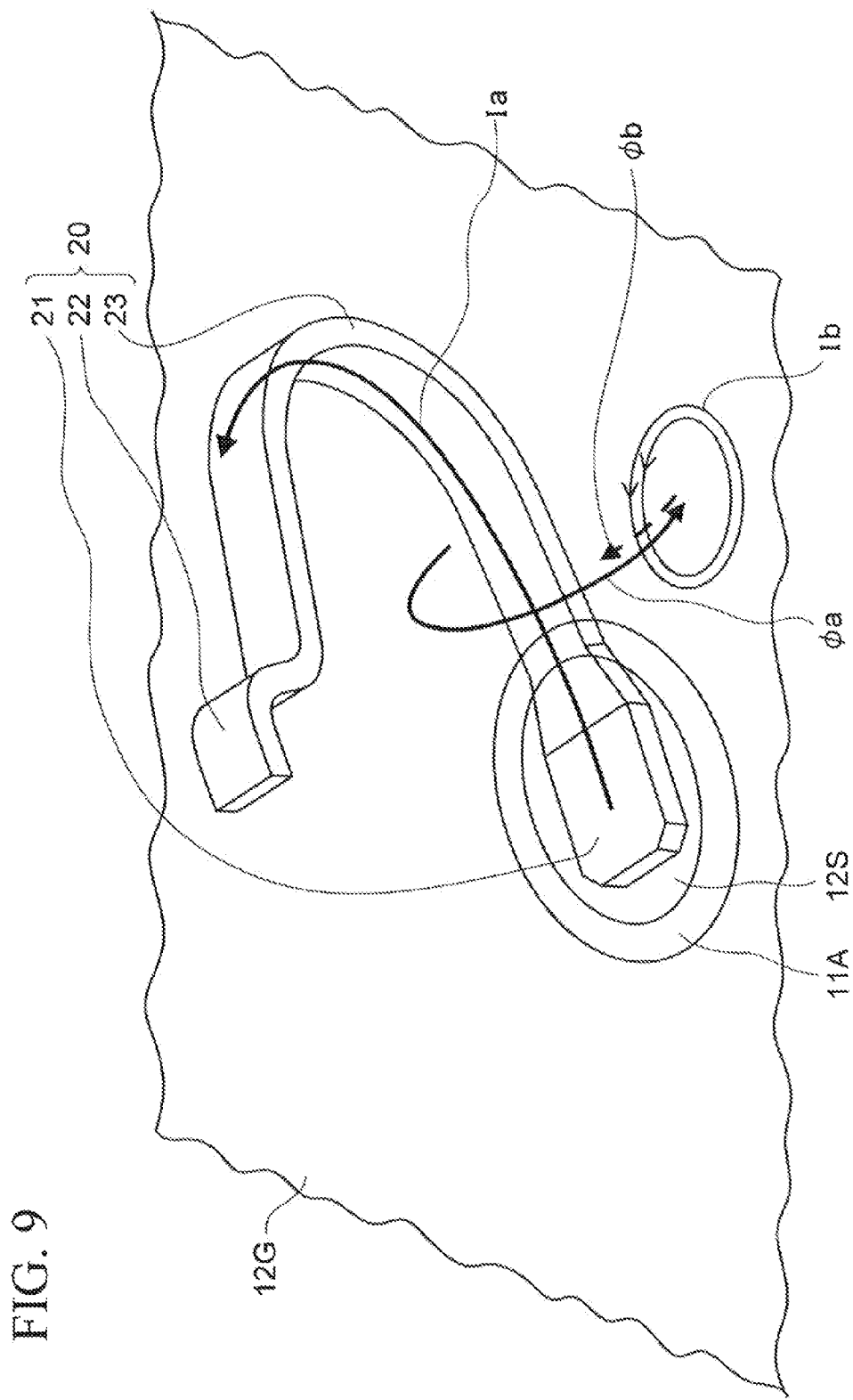
FIG. 9 is a view explaining a merit (#2) which is obtained by arranging the GND plane in the very near vicinity of the spring terminal.

FIG. 9 depicts schematically the relationship between a current flowing in the spring terminal 20, and a magnetic flux and an eddy current which are generated by this current.

When an electric signal is transmitted to the spring terminal 20, a current Ia flows in this spring terminal 20, and then a magnetic field is generated by this current Ia, and thus a magnetic flux φa is formed. When the magnetic flux φa generated from the spring terminal 20 hits the GND plane 12G, a current (an eddy current Ib) is induced on the GND plane 12G by the magnetic flux φa. Based on the Lenz's law, this induced eddy current Ib flows in the direction to obstruct the magnetic flux φa generated from the spring terminal 20. That is, by this eddy current Ib, a magnetic flux φb is generated in the direction to obstruct the magnetic flux φa.

By this matter, the magnetic flux φa generated by that the current Ia flows in the spring terminal 20 is negated by the magnetic flux φb which is generated by the eddy current Ib induced on the GND plane 12G, and thus the magnetic flux of the spring terminal 20 is weakened. As a result, the inductance (the inductance component L depicted in FIG. 8) of the spring terminal 20 is decreased. That is, by arranging the GND plane 12G in the very near vicinity of the spring terminal 20, the characteristic impedance Z0 of the spring terminal 20 can be varied. This means that the characteristic impedance 20 can be adjust.

Figure 10A:
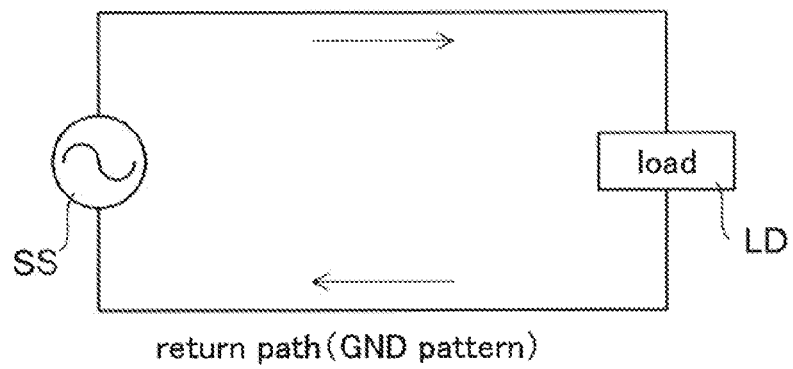
FIGS. 10A and 10B are views explaining a merit (#3) which is obtained by arranging the GND plane in the very near vicinity of the spring terminal.
Figure 10B:
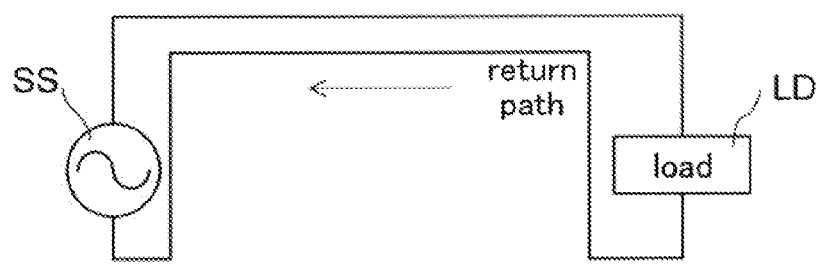
Figure 11:
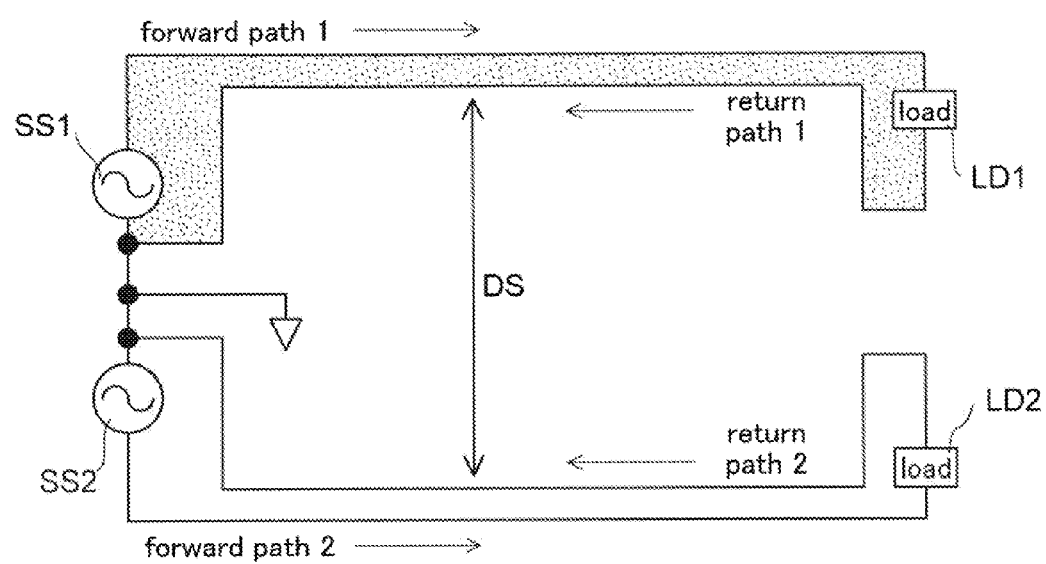
FIG. 11 is a view explaining a merit (#4) which is obtained by arranging the GND plane in the very near vicinity of the spring terminal.

FIGS. 10A and 10B and FIG. 11 depict schematically a closed circuit (closed loop) which is formed by the paths of the currents which flow between the spring terminal 20 and the GND plane 12G.

In the case that the signal is output from the LSI (the LGA package 40) mounted in the LGA socket toward the motherboard 50, the LSI side serves as a "signal source SS (SS1, SS2)", and the device for receiving the signal on the motherboard side serves as a "load LD (LD1, LD2)". In the case that the signal is output in the opposite direction, the motherboard side serves as the "signal source", and the LSI which receives the signal serves as the "load". In both cases, a closed circuit is formed between the signal source and the load (see FIGS. 10A and 10B). But, the closed loop circuit depicted in FIG. 10A is shown as a comparative example, and corresponds to the case where the GND plane is not provided.

In one closed loop circuit having the signal source, when the signal is transmitted to the load through the transmission path, a current flows (forward path), and then the current flows to the ground (GND) located in a very near vicinity of the load, and goes back to the signal source as a return current (return path). At this time, the return current flows through the part (the part where the impedance is lowest), which is closest to the signal wiring (forward path), on the GND plane 12G.

The "return path" depicted in FIG. 10B, and a "return path 1" and a "return path 2" depicted in FIG. 11 correspond to the part, which is adjacent to the spring terminal 20, of the GND plane 12G arranged on the F-face 11A.

An inductance is generated when the current flows through such closed loop circuit. In general, an inductance of a loop coil is in proportion to a loop area of the coil. Therefore, the inductance of the loop coil can be made lower by decreasing the loop area.

Accordingly, like the present embodiment, the GND plane 12G is arranged in the very near vicinity of the spring terminal 20, the return current flows through there. As a consequence, the closed circuit containing the spring terminal 20 as a part of the signal transmission path can be served as the closed loop whose loop area is made smallest (see FIG. 10B). This contributes to a reduction of the loop inductance.

Also, the area of the closed loop formed by the closed circuit containing the spring terminal 20 is made smallest (the part depicted by the pear-skin pattern in FIG. 11), so that a closed loop distance DS between the adjacent spring terminals 20 is expanded. As a result, a mutual inductance between the closed loops can be reduced, and thus it becomes hard to receive an interference of the inductive noise emitted from the adjacent spring terminal 20 (a reduction of the mutual interference noise). That is, the noise induced in the signal transmission path containing the spring terminal 20 can be reduced.

Figure 12A:
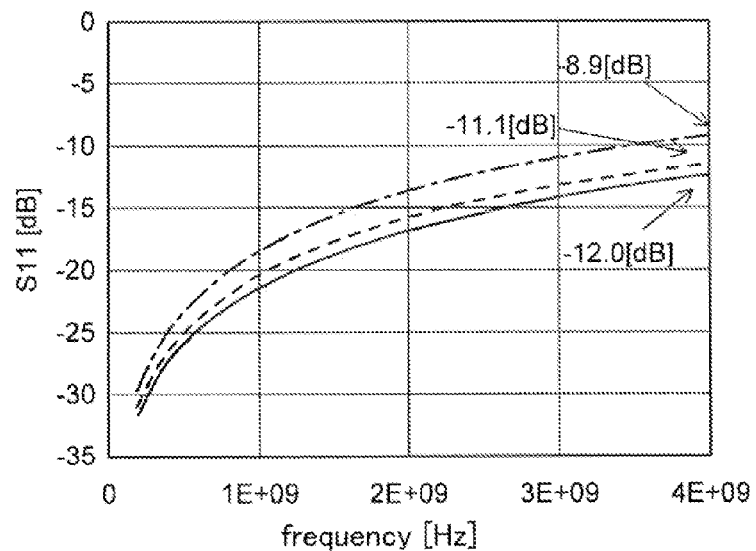
FIGS. 12A and 12B are views depicting analyzed results of the transmission characteristics based on the simulation.
Figure 12B:
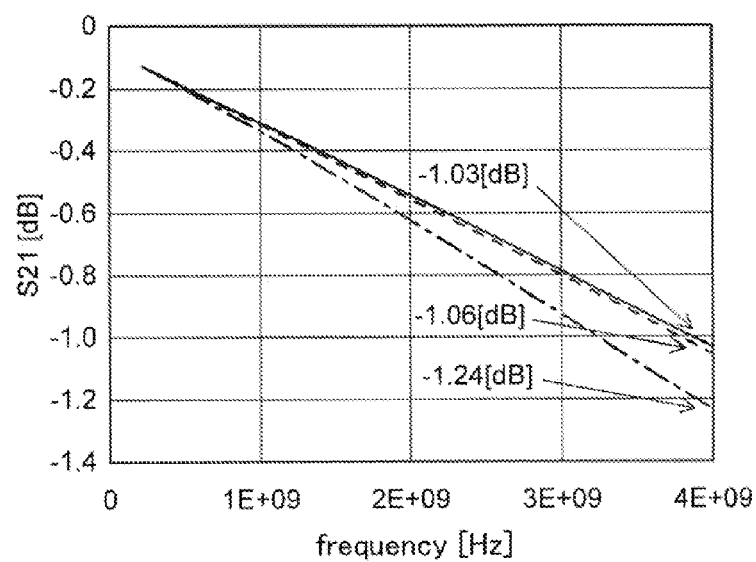

FIGS. 12A and 12B show the analyzed results of the transmission characteristics derived based on the simulation. As the analyzing tool, the electromagnetic field analyzing tool (HFSS13.0) manufactured by ANSOFT Corporation was used, and the analysis was made in a frequency range of 0 to 4 GHz. Also, with respect to the ports selected as the analyzed target, as the driver to output the signal from the LSI (the LGA package 40), the ports 1 (the pads 41 of the LGA package 40), and the ports 2 (the pads 51 of the motherboard 50) are decided. Also, S11 (the reflection characteristic) and S21 (the transmission characteristic) were selected as the analyzed S parameters.

FIG. 12A and FIG. 12B show the reflection characteristic (S11) and the transmission characteristic (S21) of the S parameter to a change of the frequency. Also, a solid line denotes the transmission characteristic in the case that the GND planes 12G, 13G are arranged on both the F-face 11A and the B-face 11B, a broken line denotes the transmission characteristic in the case that the GND plane 12G is arranged only on the F-face 11A, and a dot-dash line denotes the transmission characteristic in the case that the GND plane does not exist.

When the GND plane 12G is arranged only on the F-face 11A, the reflection characteristic (S11) was improved by 2.2 dB in comparison with the case where the GND plane does not exist (see FIG. 12A). Also, when the GND planes 12G, 13G are arranged on both the F-face 11A and the B-face 11B, the wiring impedance matching can be achieved, and as a result the reflection characteristic (S11) was improved by 3.1 dB in comparison with the case where the GND plane does not exist.

With respect to the transmission characteristic (S21), no significant difference in the advantage of the characteristic improvement achieved by the wiring impedance matching was appeared between the case where the GND plane 12G is arranged only on the F-face 11A and the case where the GND planes 12G, 13G are arranged on the F-face 11A and B-face 11B. Nevertheless, in both cases, the advantage of the characteristic improvement was appeared in comparison with the case where the GND plane does not exist.

Second Embodiment: See FIG. 13, FIGS. 14A and 14B

Figure 13:
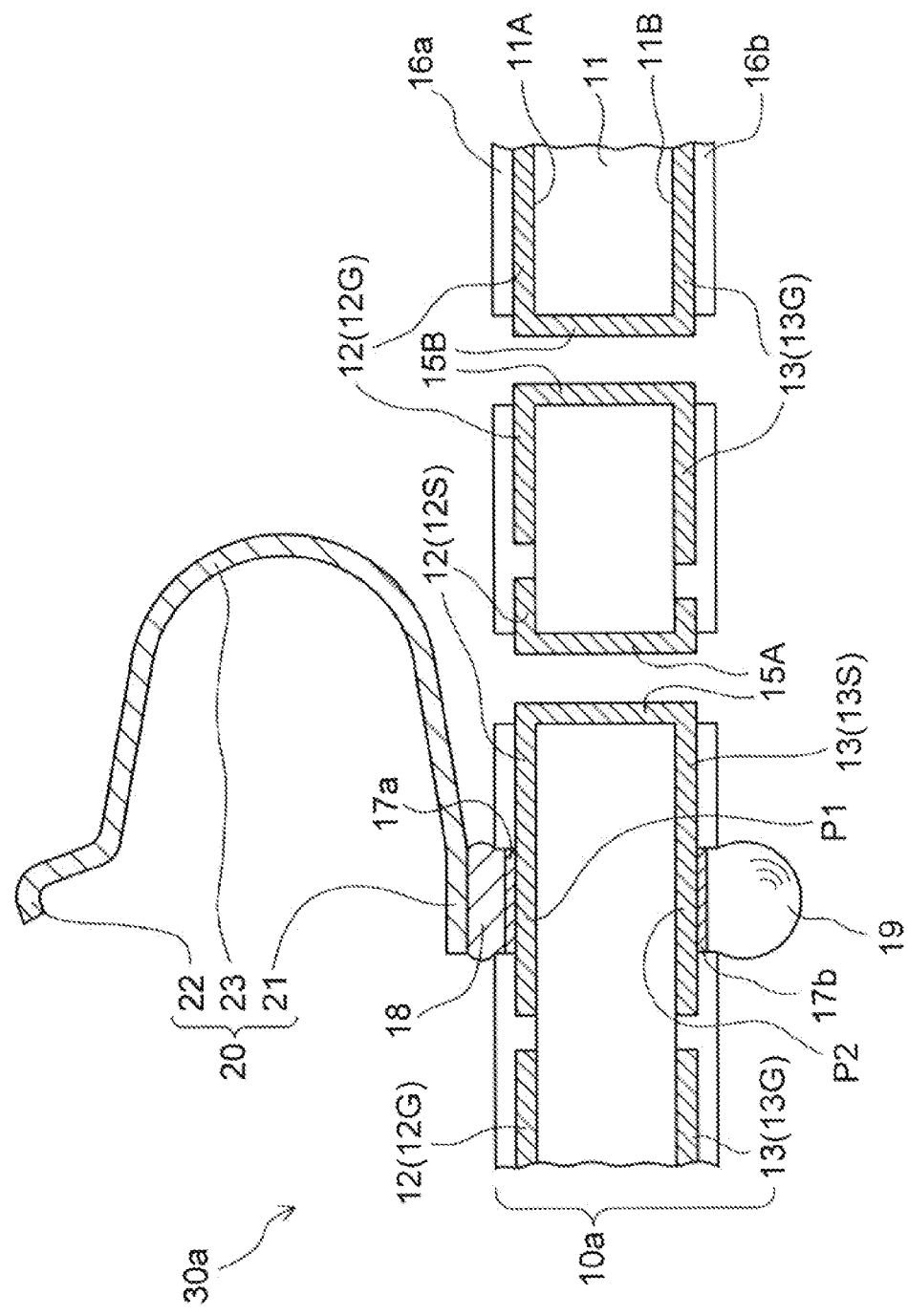
FIG. 13 is a sectional view depicting a constitution of a wiring substrate with spring terminal according to a second embodiment.
Figure 14A:
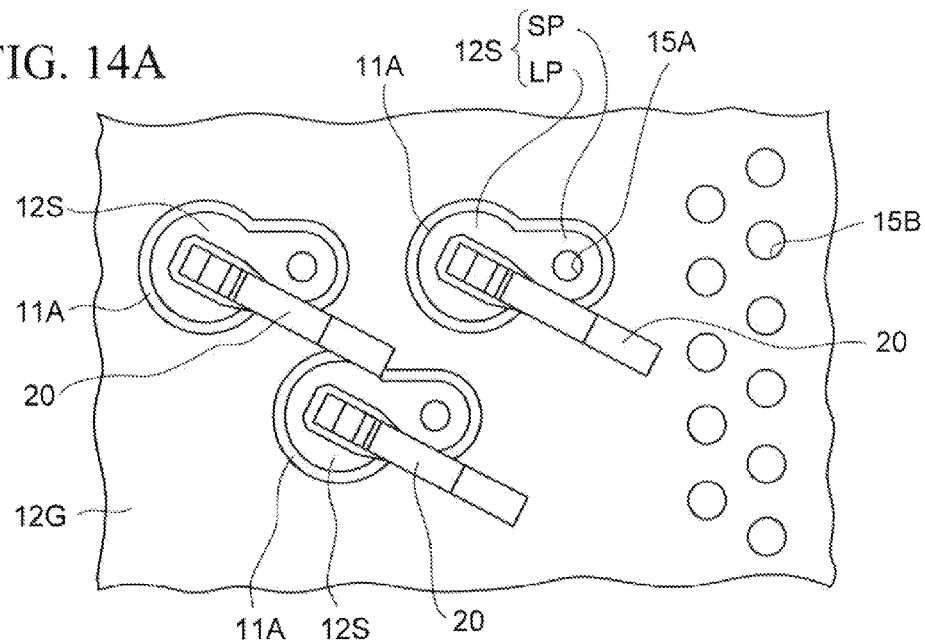
Figure 14B:
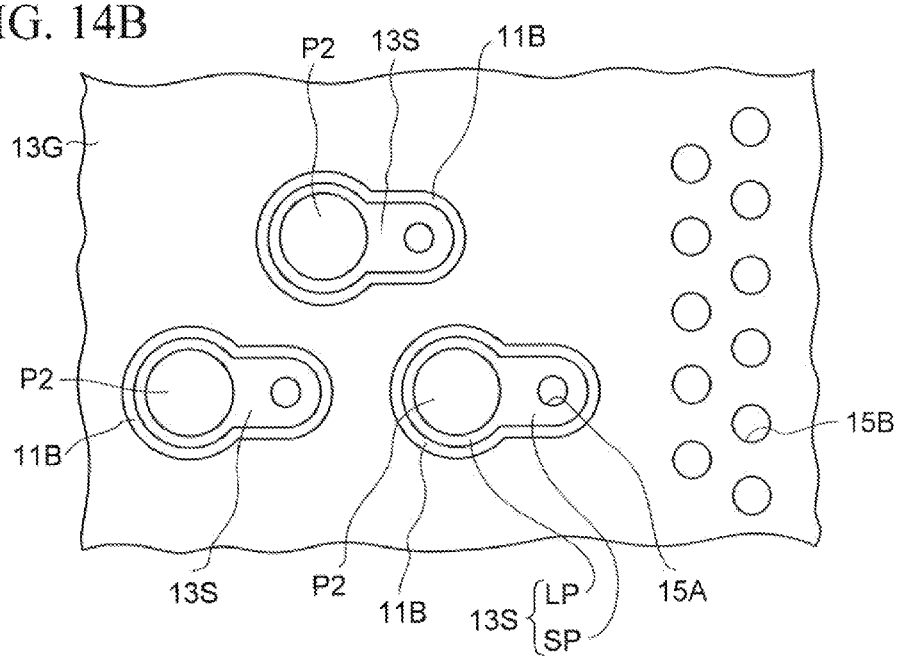

FIG. 13 depicts a constitution of a wiring substrate with spring terminal 30a according to a second embodiment in the form of a sectional view. Also, FIGS. 14A and 14B depict a schematic constitution of the wiring substrate with spring terminal 30a depicted in FIG. 13 when viewed from both surface sides. FIG. 14A is a top view of the wiring substrate 30a when viewed from the surface on which spring terminals 20 are mounted, and FIG. 14B is a bottom view of the wiring substrate 30a when viewed from the surface on the opposite side. In the constitutions in FIGS. 14A and 14B, the illustrations of the solder resist layers 16a, 16b, the Ni/Au plating layers 17a, 17b, the solders 18, and the solder balls 19 are omitted.

The wiring substrate with spring terminal 30a according to the second embodiment (FIG. 13, FIGS. 14A and 14B) is different from the above wiring substrate with spring terminal 30 according to the first embodiment (FIG. 1, FIGS. 2A and 2B) in the following respects. Specifically, in the second embodiment, the wiring patterns 12S, 13S are formed such that, when a wiring substrate 10a is viewed from the top, positions of the pads P1 (the Ni/Au plating layers 17a) to which the spring terminal 20 is joined through the solder 18, and positions of the pads P2 (the Ni/Au plating layers 17b) to which the solder ball 19 is joined, are overlapped with each other. Therefore, unlike the above constitution in FIG. 2A of the first embodiment, the wiring pattern 12S (see FIG. 14A) arranged on the upper surface side (the F-face 11A of the resin substrate 11) of the wiring substrate 10a has such a shape that the large circular part LP and the small circular part SP are reversed in the right and left direction.

The constitutions of other parts in the wiring substrate with spring terminal 30a and the grounding means of the GND planes (the GND patterns 12G, 13G) are similar to those in the first embodiment. Therefore, their explanations will be omitted hereunder.

In this second embodiment (FIG. 13, FIGS. 14A and 14B), like the above constitution of the first embodiment (FIG. 1, FIGS. 2A and 2B), the GND plane 12G is arranged (in a very near vicinity of the wiring patterns 12S) to surround the wiring patterns 12S to which the spring terminal 20 is connected respectively. By this matter, the similar operational advantages can be achieved. That is, adjustment of the impedance matching between the spring terminal 20 and the wiring pattern (12S, 13S, or the like) on the substrate can be done.

Further, in the second embodiment, in the case the pads P2 are provided with a pitch equal to that of the pads P1, when the wiring patterns are drawn around as depicted in FIG. 13, a length of the wiring between the pad P1 and the pad P2 can be shortened. This layout is advantageous to the electric characteristics, and contributes particularly to improvement of the above-mentioned signal transmission characteristics (S parameters).

Third Embodiment: See FIG. 15, FIGS. 16A and 16B

Figure 15:
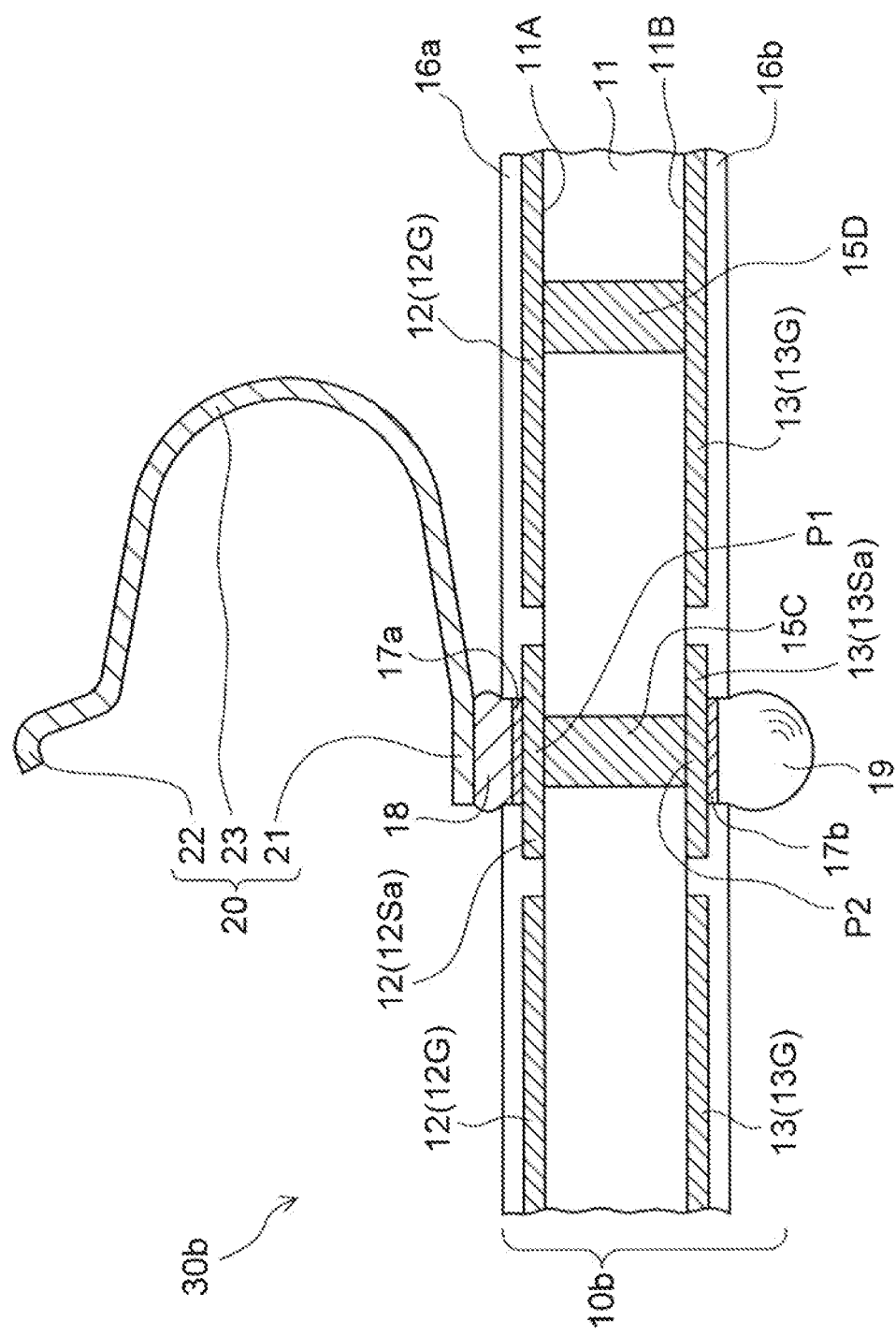
FIG. 15 is a sectional view depicting a constitution of a wiring substrate with spring terminal according to a third embodiment.

FIG. 15 depicts a constitution of a wiring substrate with spring terminal 30b according to a third embodiment in the form of a sectional view. Also, FIGS. 16A and 16B depict a schematic constitution of the wiring substrate with spring terminal 30b depicted in FIG. 15 when viewed from both surface sides. FIG. 16A is a top view of the wiring substrate 30b when viewed from the surface on which spring terminals are mounted, and FIG. 16B is a bottom view of the wiring substrate when 30b viewed from the surface on the opposite side. In the constitutions in FIGS. 16A and 16B, illustrations of the solder resist layers 16a, 16b, the Ni/Au plating layers 17a, 17b, the solders 18, and the solder balls 19 are omitted.

The wiring substrate with spring terminal 30b according to the third embodiment (FIG. 15, FIGS. 16A and 16B) is different from the constitution of the above wiring substrate with spring terminal 30 according to the first embodiment (FIG. 1, FIGS. 2A and 2B) in following respects.

First, respective wiring patterns 12Sa, 13Sa are formed such that, when a wiring substrate 10b is viewed from the top, positions of the pads P1 (the Ni/Au plating layers 17a) to which the spring terminal 20 is joined through the solder 18, and positions of the pad P2 (the Ni/Au plating layers 17b) to which the solder ball 19 is joined, are overlapped with each other. Also, unlike the above shapes of the wiring patterns 12S, 13S of the first embodiment (see FIGS. 2A and 2B), the wiring patterns 12Sa, 13Sa (see FIGS. 16A and 16B) are patterned in a circular shape.

Further, the pad P1 to which the spring terminal 20 is joined and the pad P2 to which the solder ball 19 is joined are electrically connected through a via 15C, which is provided to penetrate the resin substrate 11. Similarly, the GND patterns 12G and 13G, which are formed on the F-face 11A and the B-face 11B of the resin substrate 11 respectively, are electrically connected through a via 15D, which is provided to penetrate the resin substrate 11. The respective vias 15C, 15D can be formed by forming a through hole (e.g., a diameter of which is set to about 150 μm) in predetermined locations of the resin substrate 11 respectively, and then filling the conductive material (conductor) in the through holes.

The constitutions of other parts in the wiring substrate with spring terminal 30b and the grounding means of the GND planes (the GND patterns 12G, 13G) are similar to those in the first embodiment. Therefore, their explanations will be omitted hereunder.

In the third embodiment (FIG. 15, FIGS. 16A and 16B), like the above case of the first embodiment (FIG. 1, FIGS. 2A and 2B), the GND plane 12G is arranged (in a very near vicinity of the wiring patterns 12Sa) to surround the wiring patterns 12Sa to which the spring terminal 20 is connected. By this matter, the similar operational advantages can be achieved. That is, adjustment of the impedance matching between the spring terminal 20 and the wiring pattern (12Sa, 13Sa, or the like) on the substrate can be done.

Also, in the third embodiment, the pad P1 to which the spring terminal 20 is joined and the pad P2 to which the solder ball 19 is joined are connected through the via 15C. Accordingly, a length of the signal propagation paths (a length of the wirings) between the spring terminal 20 and the external connection terminal (the solder ball 19) can be made shortest. This contributes to the improvement of the above-mentioned signal transmission characteristics (S parameters).

Fourth Embodiment: See FIG. 17

Figure 17:
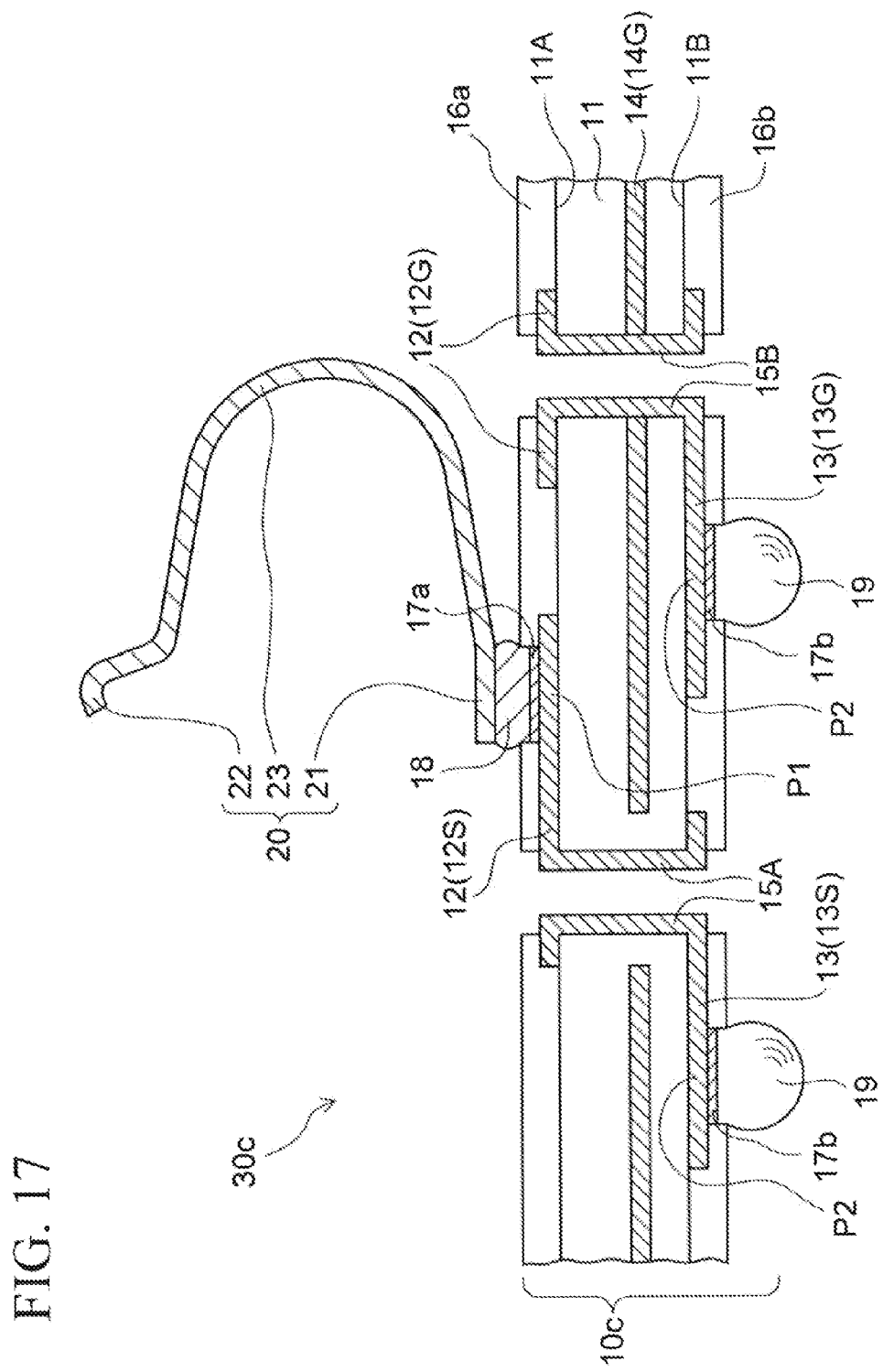
FIG. 17 is a sectional view depicting a constitution of a wiring substrate with spring terminal according to a fourth embodiment.

FIG. 17 depicts a constitution of a wiring substrate with spring terminal 30c according to a fourth embodiment in the form of a sectional view.

The wiring substrate with spring terminal 30c (FIG. 17) according to this fourth embodiment is different from the constitution of the above wiring substrate with spring terminal 30 (FIG. 1) according to the first embodiment in that a GND pattern 14G is built in an inner layer part of a wiring substrate 10c. More specifically, the GND pattern 14G is provided in an inner wiring layer 14 positioned just below the wiring pattern 12S to which the spring terminal 20 is connected.

The constitutions of other parts in the wiring substrate with spring terminal 30c, and the grounding means of the GND plane (the GND pattern 14G) are basically similar to those in the first embodiment. Therefore, their explanations will be omitted hereunder.

Also in this fourth embodiment (FIG. 17), like the case of the above first embodiment (FIG. 1), the GND pattern 14G is arranged in a vicinity (positioned just below the wiring pattern 12S) of the wiring pattern 12S to which the spring terminal 20 is connected. As a result, the similar operational advantages can be achieved. That is, adjustment of the impedance matching between the spring terminal 20 and the wiring pattern (12S, 13S, or the like) on the substrate can be done.

Here, in the example in FIG. 17, the wiring substrate 10c is formed as a three-layer structure, but the multilayer structure having four layers, or more may be employed. In this case, all remaining wiring layers (the inner layer side) except the outermost wiring layers 12, 13 may be formed as the GND plane. Otherwise, such a constitution may be employed that not only the GND patterns 12G, 13G are provided to the outermost wiring layers 12, 13, like the first to third embodiments, but also the GND pattern 14G is provided to the inner wiring layer 14, like the fourth embodiment.

In the above embodiment, the explanation is done to enumerate, as an example, the case where the wiring substrate with spring terminal 30 (30a, 30b, 30c) is applied as a part of the LGA socket (for the use of mounting the LGA package 40). But, it is of course that the application mode of the wiring substrate with spring terminal of the present invention is not restricted to this mode. For example, the wiring substrate with spring terminal of the present invention can be applied as the interposer or a part of the socket for the semiconductor package testing device, or the like.

Although not particularly depicted, the wiring substrate with spring terminal in the case which is applied as the interposer has such a structure that the spring terminals are joined to both surfaces of the wiring substrate respectively. The constitution of the wiring substrate is basically same with the constitution of the wiring substrate 10 (10a, 10b, 10c). In this event, the solder ball 19 mounted on the pad P2 (the Ni/Au plating layer 17b) which is provided on the bottom surface side of the wiring substrate 10 (10a, 10b, 10c) is not needed. Instead, the solder is deposited onto the pad P2 (the Ni/Au plating layer 17b), and then the junction part 21 of the spring terminal 20 is joined onto the pad P2 through this solder.

The wiring substrate with spring terminal (interposer) having such structure can be used in the similar mode to the wiring substrate with spring terminal 30 in the mounting structure depicted in FIG. 3. More particularly, the spring terminal 20 on the tipper surface side of this interposer is used in the connection of the pad 41 of the LGA package 40 through the contact part 22, while the spring terminal 20 on the opposite side (bottom surface side) is used in the connection to the pad 51 of the motherboard 50 through the contact part 22.

Also, in the above embodiments, the explanations are done to enumerate, as an example, the case where the resin substrate 11 is used as the substrate main body of the wiring substrate 10 (10a, 10b, 10c). But, it is of course that the mode of the substrate main body is not restricted to this mode. For example, the silicon substrate may be used. As the mode of the substrate main body in this case, a plurality of through holes (a diameter of which is about 100 μm) are formed in the silicon substrate, and the conductive material (e.g., Cu) is filled in the through holes to form the penetration electrode. At that time, the penetration electrodes are formed such that their both end surfaces constitute the same planes as both surfaces of the silicon substrate respectively. Also, an insulating film (e.g., silicon oxide film) is formed between the penetration electrodes and the substrate main body (silicon substrate). In this substrate main body (silicon substrate), both end surfaces of the penetration electrodes exposed from the substrate surface correspond to the above pads P1, P2.

Also, in the above first to third embodiments, the explanation is done to enumerate, as an example, the case where the completely "plane layer" pattern is formed as the GND planes 12G, 13G. However, it is of course that the patterns of the GND planes 12G, 13G are not restricted to this pattern. For example, the GND planes 12G, 13G may be formed as a mesh-like patter or a pattern in which openings are provided in a matrix fashion. By using such pattern, areas of the parts in which the solder resist layers 16a, 16b and the resin substrate 11 contact directly are increased, and thus their mutual adhesion property is improved.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A wiring substrate with spring terminal, comprising:
    a wiring substrate including a first face, a second face on an opposite side to the first face, and a wiring layer provided on the first face, and the wiring layer including a plurality of first wiring patterns for a signal transmission and a first ground pattern grounded to a ground potential; and
    a plurality of spring terminals connected to the plurality of first wiring patterns of the wiring substrate respectively, the respective spring terminals including a spring part having a curved shape, a junction part formed to an edge part of the spring part and a contact part formed to an opposite edge part of the spring part, wherein the junction part is connected to the first wiring patterns, and the contact part is arranged to an upper area of the junction part,
    wherein the first ground pattern is insulated from the first wiring patterns by a non-variable clearance between the first ground pattern and the entire periphery of the first wiring patterns, and is formed on the first face to surround an entire periphery of respective first wiring patterns, and the spring part of the respective spring terminals extends to an upper area of the first ground pattern surrounding the first wiring patterns,
    wherein a capacitance component is formed between the spring part of the spring terminal and the first ground pattern located in vicinity of the spring part, thereby a characteristic impedance of the spring terminal connected to the first wiring patterns for the signal transmission is adjusted.

2. A wiring substrate with spring terminal, according to claim 1, wherein a wiring layer provided on the second face of the wiring substrate includes a second wiring pattern connected electrically to the first wiring pattern through a via, and a second ground pattern connected electrically to the first ground pattern through a via, and
    the second ground pattern is insulated from the second wiring pattern, and is formed on the second face to surround the second wiring pattern.

3. A wiring substrate with spring terminal, according to claim 1, wherein a third ground pattern grounded to the ground potential is provided in a part, which is positioned below the first wiring pattern, of a wiring layer which is provided to an inner layer in the wiring substrate.

4. A wiring substrate with spring terminal, according to claim 2, wherein a first pad to which the spring terminal is joined, on the first wiring pattern, and a second pad to which an external connection terminal is joined, on the second wiring pattern, are connected mutually through a via.

5. A mounting structure of a wiring substrate with spring terminal, comprising:
    the wiring substrate with spring terminal set forth in claim 1;
    a connected member; and
    a mounting substrate;
    wherein the wiring substrate with spring terminal contacts an electrode terminal on the connected member through the spring terminal, and is connected to an electrode terminal on the mounting substrate through an external connection terminal provided on the second face side of the wiring substrate.

6. A socket comprising:
    the wiring substrate with spring terminal set forth in claim 1;
    a mounting substrate; and
    a frame having an opening portion in which the wiring substrate with spring terminal is housed;
    wherein the frame is fixed to the mounting substrate, and the wiring substrate with spring terminal is connected to an electrode terminal on the mounting substrate through an external connection terminal provided on the second face side of the wiring substrate, in the opening portion of the frame.

7. A wiring substrate with spring terminal, according to claim 1, wherein the first wiring layers have a shape in which a large circular part is connected to a small circular part respectively.

8. A wiring substrate with spring terminal, according to claim 7, wherein the spring terminal is connected onto the large circular part of the first wiring layers.

9. A wiring substrate with spring terminal, according to claim 7, wherein a via is connected to the small circular part of the first wiring layers.

10. A wiring substrate with spring terminal, according to claim 7, wherein the first wiring layers are aligned in an array fashion.

11. A wiring substrate with spring terminal, according to claim 10, wherein the spring terminal is alighted to have a predetermined angle to an arrangement direction of the first wiring layers aligned in the array fashion.

12. A wiring substrate with spring terminal, according to claim 1, further comprising,
    a second wiring layer provided on the second face of the wiring substrate, the second wiring layer including second wiring patterns connected electrically to the first wiring patterns through a via, and a second ground pattern connected electrically to the first ground pattern through a via, and
    wherein the second ground pattern is insulated from the second wiring patterns, and is formed on the second face to surround the second wiring patterns, and the via is formed of a conductive layer which is formed on a side wall of a through hole penetrating the wiring substrate, and an inside of the through hole is a hollow, and the via is formed with the same layer as the first wiring patterns, the second wiring patterns, the first ground pattern and the second ground pattern.

\* \* \* \* \*